US011172622B2

(12) United States Patent
Millar et al.

(10) Patent No.: US 11,172,622 B2
(45) Date of Patent: Nov. 16, 2021

(54) DISTRIBUTED CONTROL SYSTEMS AND METHODS FOR USE IN AN ASSEMBLY LINE GROW POD

(71) Applicant: Grow Solutions Tech LLC, Lehi, UT (US)

(72) Inventors: Gary Bret Millar, Highland, UT (US); Mark Gerald Stott, Eagle Mountain, UT (US); Michael Stephen Hurst, Farmington, UT (US); Kevin Hurst, Pleasant Grove, UT (US)

(73) Assignee: Grow Solutions Tech LLC, Vineyard, UT (US)

( * ) Notice: Subject to any disclaimer, the term of this patent is extended or adjusted under 35 U.S.C. 154(b) by 328 days.

(21) Appl. No.: 15/991,198

(22) Filed: May 29, 2018

(65) Prior Publication Data

US 2018/0359948 A1 Dec. 20, 2018

Related U.S. Application Data

(60) Provisional application No. 62/519,419, filed on Jun. 14, 2017, provisional application No. 62/519,420, (Continued)

(51) Int. Cl.
*A01G 9/24* (2006.01)
*H05K 7/14* (2006.01)
(Continued)

(52) U.S. Cl.
CPC ............... *A01G 9/24* (2013.01); *A01D 91/00* (2013.01); *A01G 9/088* (2013.01); *A01G 31/042* (2013.01);
(Continued)

(58) Field of Classification Search
CPC ........ A01G 9/24; A01G 9/088; A01G 31/042; A01G 9/143; A01G 31/02; H05K 7/1479;
(Continued)

(56) References Cited

U.S. PATENT DOCUMENTS

| 4,562,535 A | 12/1985 | Vincent |
| 5,479,338 A | 12/1995 | Faris et al. |

(Continued)

FOREIGN PATENT DOCUMENTS

| CN | 202165676 U | 3/2012 |
| CN | 105370962 A | 3/2016 |

(Continued)

OTHER PUBLICATIONS

International Search Report and Written Opinion for PCT/US2018/035018 dated Sep. 26, 2018, 17 pages.

(Continued)

*Primary Examiner* — Tejal Gami
(74) *Attorney, Agent, or Firm* — Dinsmore & Shohl LLP

(57) ABSTRACT

A distributed control system for use in an assembly line grow pod includes a master controller and a hardware controller device. The master controller includes a first processor and a first memory for storing a first set of instructions that dictates plant growing operations and a second set of instructions that dictates a plurality of distributed control functions. The hardware controller device is coupled to the master controller via a plug-in network interface. The hardware controller device includes a second processor and a second memory for storing a third set of instructions that dictate a selected control function of the plurality of distributed control functions. Upon the plug-in connection, the master controller identifies an address of the (Continued)

hardware controller device and sends a set of parameters defining a plurality of tasks relating to the selected control function.

20 Claims, 13 Drawing Sheets

Related U.S. Application Data filed on Jun. 14, 2017, provisional application No. 62/519,421, filed on Jun. 14, 2017, provisional application No. 62/519,425, filed on Jun. 14, 2017, provisional application No. 62/519,428, filed on Jun. 14, 2017.

(51) Int. Cl.
| | | |
|---|---|---|
| *G05B 19/418* | (2006.01) | |
| *G05B 19/042* | (2006.01) | |
| *G05B 19/18* | (2006.01) | |
| *G06F 13/40* | (2006.01) | |
| *A01D 91/00* | (2006.01) | |
| *A01G 9/08* | (2006.01) | |
| *A01G 31/04* | (2006.01) | |
| *G05B 19/04* | (2006.01) | |
| *G01N 21/84* | (2006.01) | |

(52) U.S. Cl.
CPC ....... *G05B 19/041* (2013.01); *G05B 19/0421* (2013.01); *G05B 19/0426* (2013.01); *G05B 19/18* (2013.01); *G05B 19/418* (2013.01); *G06F 13/4081* (2013.01); *H05K 7/1479* (2013.01); *G01N 2021/8466* (2013.01); *G05B 2219/2231* (2013.01); *G05B 2219/2625* (2013.01); *G05B 2219/2629* (2013.01); *G05B 2219/45017* (2013.01); *G05B 2219/45106* (2013.01)

(58) Field of Classification Search
CPC .. G05B 19/418; G05B 19/0421; G05B 19/18; G05B 19/041; G05B 19/0426; G05B 2219/45017; G05B 2219/2231; G05B 2219/45106; G05B 2219/2629; G05B 2219/2625; G06F 13/4081; G06F 9/54; A01D 91/00; G01N 2021/8466; Y02P 60/21

See application file for complete search history.

(56) References Cited

U.S. PATENT DOCUMENTS

| | | |
|---|---|---|
| 6,842,667 B2 | 1/2005 | Beutler et al. |
| 7,058,479 B2 | 6/2006 | Miller |
| 7,916,458 B2 | 3/2011 | Nelson et al. |
| 7,996,115 B2 | 8/2011 | Nickerson et al. |
| 8,010,238 B2 | 8/2011 | Ensworth et al. |
| 8,271,144 B2 | 9/2012 | Kah |
| 8,826,138 B1 | 9/2014 | Denardo |
| 9,516,822 B2 | 12/2016 | Gonyer et al. |
| 2005/0256942 A1 | 11/2005 | McCardle |
| 2009/0172125 A1 | 7/2009 | Shekhar |
| 2013/0253714 A1 | 9/2013 | Williams et al. |
| 2014/0144078 A1* | 5/2014 | Gonyer ................. A01G 31/02 47/62 A |

FOREIGN PATENT DOCUMENTS

| | | |
|---|---|---|
| CN | 106258850 A | 1/2017 |
| CN | 106489685 A | 3/2017 |
| CN | 106508467 A | 3/2017 |

OTHER PUBLICATIONS

First Office Action dated Sep. 5, 2020 in corresponding Chinese Application No. 201880004943.8.
Communication pursuant to Article 94(3) EPC dated May 6, 2020 in copending EP Application No. 18735739.7-1011.

* cited by examiner

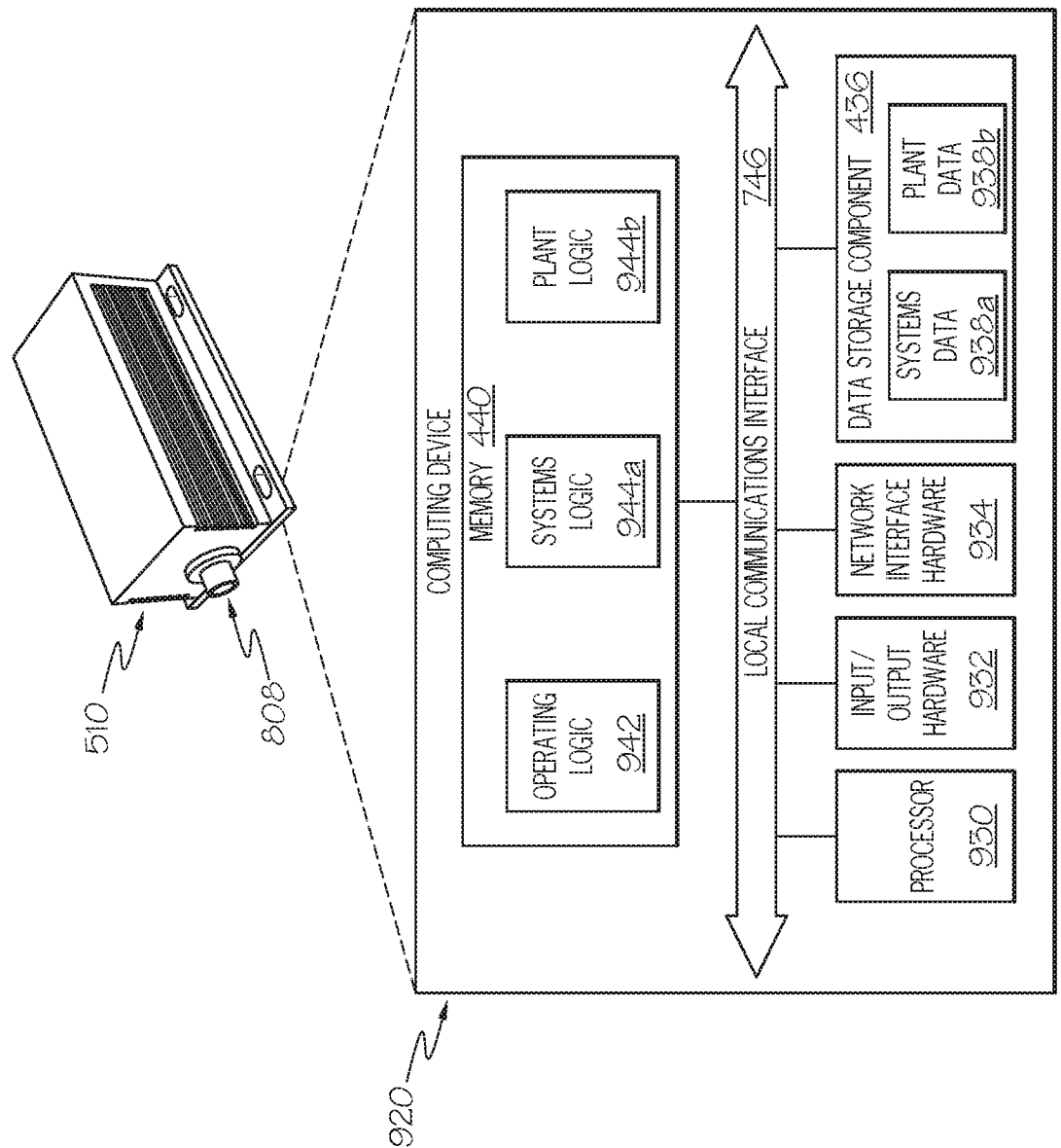

DISTRIBUTED CONTROL SYSTEMS AND METHODS FOR USE IN AN ASSEMBLY LINE GROW POD

CROSS REFERENCE

This application claims the benefit of U.S. Provisional Application Ser. No. 62/519,419, filed on Jun. 14, 2017 and entitled, "SYSTEMS AND METHODS FOR PROVIDING A MODULAR CONTROL INTERFACE IN AN ASSEMBLY LINE GROW POD," which is incorporated by reference in its entirety. This application further claims the benefit of U.S. Provisional Application No. 62/519,420, filed on Jun. 14, 2017 and entitled, "SYSTEMS AND METHODS FOR PROVIDING CROP CONTROL HARDWARE FOR A MODULAR CONTROL INTERFACE IN AN ASSEMBLY LINE GROW POD"; U.S. Provisional Applications No. 62/519,421, filed on Jun. 14, 2017 and entitled, "SYSTEMS AND METHODS FOR PROVIDING DOSAGE CONTROL HARDWARE FOR A MODULAR CONTROL INTERFACE IN AN ASSEMBLY LINE GROW POD"; U.S. Provisional Application No. 62/519,425, filed on Jun. 14, 2017 and entitled, "SYSTEMS AND METHODS FOR PROVIDING VALVE CONTROL HARDWARE FOR A MODULAR CONTROL INTERFACE IN AN ASSEMBLY LINE GROW POD"; and U.S. Provisional Application No. 62/519,428, filed on Jun. 14, 2017 and entitled, "SYSTEMS AND METHODS FOR PROVIDING PUMP CONTROL HARDWARE FOR A MODULAR CONTROL INTERFACE IN AN ASSEMBLY LINE GROW POD," disclosure of which are incorporated by reference in their entirety.

TECHNICAL FIELD

Embodiments described herein generally relate to distributed control systems and methods for use in an assembly line grow pod and, more specifically, to distributed control systems and methods for providing a master controller and a plurality of control modules configured to perform distributed functions for controlling operations of various components of the assembly line grow pod to seamlessly and efficiently run the assembly line grow pod.

BACKGROUND

While crop growth technologies have advanced over the years, there are still many problems in the farming and crop industry today. As an example, while technological advances have increased efficiency and production of various crops, many factors may affect a harvest, such as weather, disease, infestation, and the like. Additionally, while the United States currently has suitable farmland to adequately provide food for the U.S. population, other countries and future populations may not have enough farmland to provide the appropriate amount of food.

An organized plant grow pod system facilitates a quick growing, small footprint, chemical free, low labor solution to growing microgreens and other plants for harvesting. The organized plant grow pod system may provide controlled and optimal environmental conditions (e.g., the timing and wavelength of light, pressure, temperature, watering, nutrients, molecular atmosphere, and/or other variables) in order to maximize plant growth and output. In the organized plant grow pod, it is important to monitor and check growth patterns and growth status of plants or seeds in order to provide individual and customized care for each plant or seed and take proper measure for plants or seeds experiencing growth problems.

The organized plant grow pod simultaneously supports a large number of diverse plants and seeds which require diverse and different environmental conditions such as watering, lighting, nutrient feeds, air pressure, humidity, temperature, atmosphere, oxygen level, $CO_2$ levels etc. Once plants and seeds enter into the organized plant grow pod, continuous control and supply of the environmental conditions may be required until harvesting of plants. Such control and supply of the environmental conditions have been automated with use of computing systems.

The computing systems control operations of various components of the organized plant grow pod. The computing systems for use with the organized plant grow pod may need to determine customized environmental conditions and control various components to provide timely and precise environmental conditions. For instance, there may be several different plants which require different amount and frequency of watering and nutrient feeds along with different growth cycle and lighting requirements. Addressing each different need by different plants population and effectively controlling relevant components tend to require huge processing resource and processing load. In carrying out numerous and continuous tasks, the computing systems may experience high processing burden. In addition, even a short downtime of the computing systems may significantly affect the growth conditions of several plants and seeds and the maintenance and operations of the entire organized plant grow pod may be unfavorably affected as well. For instance, when an operating system of the computing systems may be upgraded and require complete resetting of the computing systems, such reset or restart operation of the computing systems may not be acceptable to the organized plant grow pod environment.

Additionally, the organized plant grow pod environment may significantly vary. For instance, the organized plant grow pod may have a few trays supporting plants, or a large number of trays supporting plants. The organized plant grow pod may include various assets such as watering robots, light emitting diode (LED) lighting devices, water pumps, valves, water lines, carts, fluid tanks, etc. A small grow pod may not utilize all of available assets, whereas a large grow pod requires utilization of more assets. If the organized plant grow pod may be automated with the computing systems designed and configured to operate a small grow pod, it is difficult to utilize such computing systems for a grow pod having a larger scale. Some of assets may not be put to use even though those assets are available. Similarly, the computing systems configured to operate a large grow pod may not effectively and efficiently maintain a small grow pod. Moreover, while the organized grow pod is operating, some of assets may be out of order and require repair, or complete replacement. Redesigning and reconfiguring automated systems to accommodate each different organized plant grow pod and ongoing change in inventory of assets may result in unwanted waste of resources and inefficiency.

Accordingly, there is a need to provide a control system for use in the organized plant grow pod that can distribute control functions to facilitate the most efficient use of assets available in the organized plant grow pod and distribution of processing load from a main controller as needed. Also, there is a need to provide reliable and compatible control systems that can facilitate repair, reprogramming, redeployment and expansion of control systems as needed without causing downtime of operations of the organized plant grow pod.

SUMMARY

Systems and methods for providing a distributed control system are described. In one embodiment, a distributed control system for use in an assembly line grow pod includes a control housing, a master controller, and a hardware controller device. The control housing includes a plurality of bays shaped and sized to place one or more discrete hardware controller devices. Each bay is equipped with a plug-in network interface. The master controller resides in the control housing and includes a first processor and a first memory. The first memory stores a first set of instructions that dictates plant growing operations and a second set of instructions that dictates a plurality of distributed control functions. The hardware controller device is communicatively and removably coupled to the master controller via the plug-in network interface at the time of placement in a bay of the control housing. The hardware controller device includes a second processor and a second memory for storing a third set of instructions that dictate a selected control function of the plurality of distributed control functions. Upon connection into the plug-in network interface, the master controller identifies an address of the hardware controller device and sends a set of parameters defining a plurality of tasks relating to the selected control function to the hardware controller device.

In another embodiment, a distributed control system for use in an assembly line grow pod includes a master controller, a first hardware controller device, a second hardware controller device, and a plug and play network interface. The master controller includes a first processor and a first memory for storing a first set of commands that dictates plant growing operations. The first hardware controller device includes a second processor and a second memory for storing a second set of commands that controls operations of a first component. The second hardware controller device includes a third processor and a third memory for storing a third set of commands that controls operations of a second component. The first component and the second component perform operations that are a part of the plant growing operations dictated by the first set of commands. The plug and play network interface is adapted to communicatively and removably connect the master controller with the first hardware controller device and the second hardware controller device using a common communication protocol.

In yet another embodiment, a method for providing a distributed control system for use in an assembly line grow pod includes the steps of (i) arranging a control housing comprising a plurality of bays shaped and sized to place one or more discrete hardware controller devices, each bay equipped with a plug-in network interface; (ii) arranging a master controller to reside in the control housing, wherein the master controller comprises a first processor and a first memory for storing a first set of instructions that dictates plant growing operations and a second set of instructions that dictates a plurality of distributed control functions; (iii) connecting a hardware controller device with the master controller by plugging the hardware controller device in the plug-in network interface of a bay; (iv) identifying, with the master controller, an address of the hardware controller device; (v) sending, from the master controller to the hardware controller device, a set of parameters defining a plurality of tasks relating to the selected control function; and (vi) controlling, with the hardware controller device, operations of one or more components operating in an assembly line grow pod to perform the plurality of tasks. The hardware controller device includes a second processor and a second memory for storing a third set of instructions that dictate a selected control function of the plurality of distributed control functions.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which:

FIG. 7B depicts an internal configuration of the hardware controller as shown in FIG. 7A;

DETAILED DESCRIPTION

Embodiments disclosed herein include systems and methods for providing a distributed control system for use in an assembly line grow pod. A master controller as a main controller controls operations of various components of the assembly line grow pod. The master controller operates with a plurality of control modules that performs distributed specific functions. The control modules include hardware controllers customized to control various components of the assembly line grow pod. In order to facilitate communications with and control of the plurality of control modules, the master controller may provide a modular control interface such as a plug and play network interface.

The distributed control system is configured and structured to accommodate assets available and operating in the assembly line grow pod. In some embodiments, assets may include plants, carts, various hardware components, such as valves, pumps, fluid tanks, watering robots, water lines, air pipes, light emitting diode (LED) lighting devices, tracks, trays, etc. The distributed control system identifies assets available in the assembly line grow pod and determines how to distribute control functions between the master controller and discrete control modules in order to optimize utilization of assets. The distributed control system further takes into consideration efficiency, reliability and sustainability of running the assembly line grow pod in implementing distribution of control functions with discrete control devices.

Some embodiments are configured with an assembly line of plants that follow a track that wraps around a first axis in a vertically upward direction and wraps around a second axis in vertically downward direction. These embodiments may utilize light emitting diode (LED) components for simulating a plurality of different light wavelengths for the plants to grow. Embodiments may also be configured to individually seed one or more sections of a tray on a cart, as well as provide customized water and nutrients to individual cells that hold those seeds. Control of these various components may be completed at a central device that is connected, via a modular control interface, with a plurality of hot-swappable control modules, as will be described in more detail below.

Figure 1:
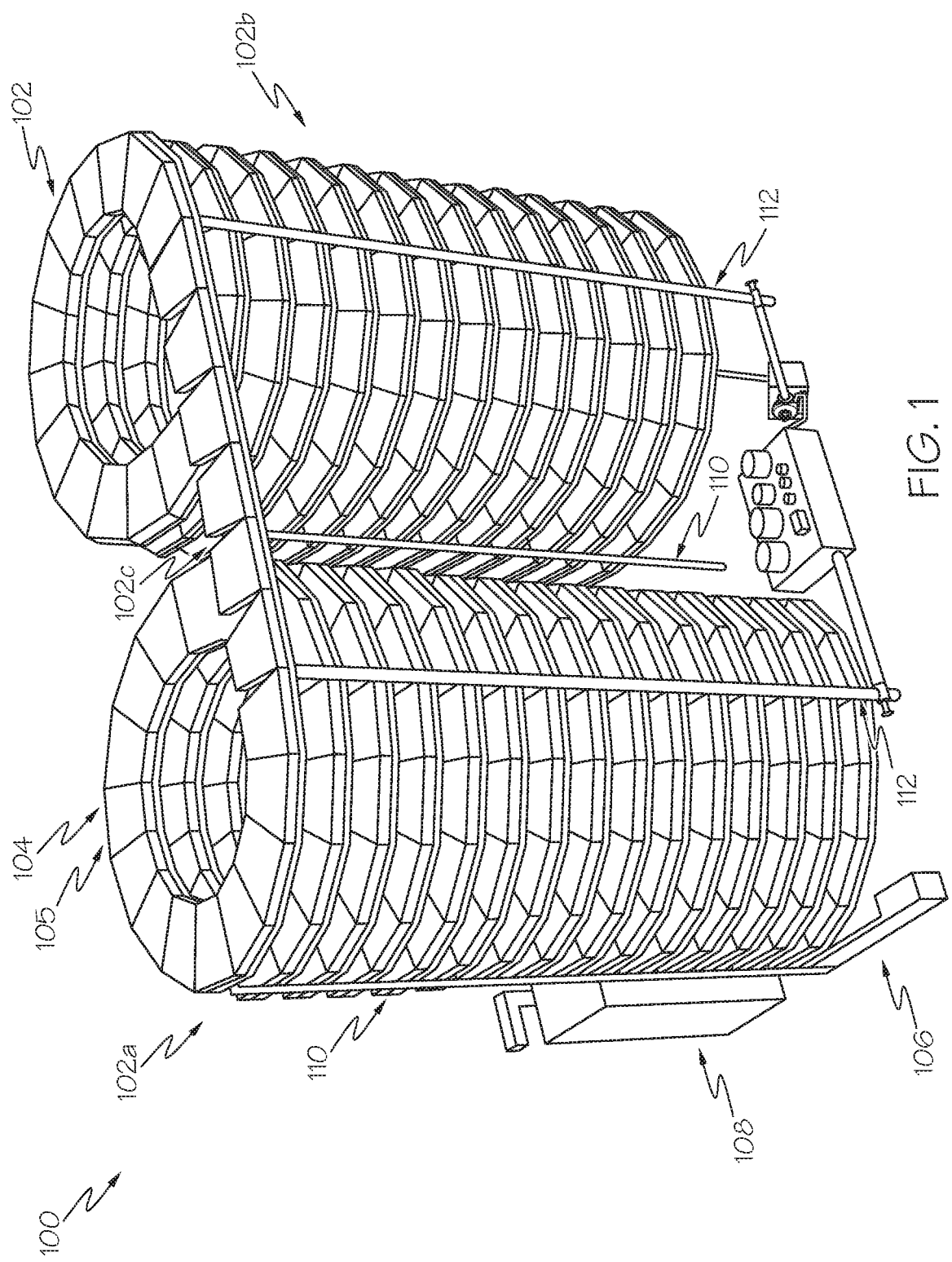
FIG. 1 depicts an illustrative assembly line grow pod according to one or more embodiments shown and described herein.

Referring now to the drawings, FIG. 1 depicts an assembly line grow pod 100, according to embodiments described herein. As illustrated, the assembly line grow pod 100 may include a track 102 that holds one or more carts 104, each of the one or more carts 104 supporting one or more trays 105 thereon. The track 102 may include an ascending portion 102*a*, a descending portion 102*b*, and a connection portion 102*c*. The track 102 may wrap around (in a counterclockwise direction in FIG. 1, although clockwise or other configurations are also contemplated) a first axis such that the carts 104 ascend upward in a vertical direction. The connection portion 102*c* may be relatively level (although this is not a requirement) and is utilized to transfer carts 104 to the descending portion 102*b*. The descending portion 102*b* may be wrapped around a second axis (again in a counterclockwise direction in FIG. 1) that is substantially parallel to the first axis, such that the carts 104 may be returned closer to ground level.

While not explicitly illustrated in FIG. 1, the assembly line grow pod 100 may also include a plurality of lighting devices, such as light emitting diodes (LEDs). The lighting devices may be disposed on the track 102 opposite the carts 104, such that the lighting devices direct light waves to the carts 104 on the portion the track 102 directly below. In some embodiments, the lighting devices are configured to create a plurality of different colors and/or wavelengths of light, depending on the application, the type of plant being grown, and/or other factors. While in some embodiments, LEDs are utilized for this purpose, this is not a requirement. Any lighting device that produces low heat and provides the desired functionality may be utilized.

Also depicted in FIG. 1 is a master controller 106. The master controller 106 may include a computing device and various control modules for controlling various components of the assembly line grow pod 100 such as a water distribution control module, a nutrient distribution control module, a crop controller module, a valve control module, a pump control module, and/or the like. In some embodiments, the control modules include discrete hardware controllers. As an example, control modules for controlling a water distribution control module, a nutrient distribution control module, an air distribution control module, etc. may be included as part of the master controller 106 which may provide a modular control interface. The modular control interface of the master controller 106 enables removal, replacement, upgrade and expansion of each control module without changing or affecting the operations of other control modules, or shutting down the master controller 106 or other components of the assembly line grow pod 100. The master controller 106 may be arranged as the modular control interface that contains a plurality of hot-swappable control modules.

In some embodiments, the master controller 106 may store a master recipe for plants that may dictate the timing and wavelength of light, pressure, temperature, watering, nutrients, molecular atmosphere, and/or other variables the optimize plant growth and output such as speed of carts, a time period that stays in the assembly line grow pod 100, etc. For example, the master recipe dictates lighting requirements on the third day of a particular plant at the assembly line grow pod 100, different lighting requirements on the fourth day of the plant, etc. As another example, the master recipe dictates watering needs, nutrient feeds, etc. directed to plants carried on the carts at particular locations for a particular day counted from the date that plants are introduced into the assembly line grow pod 100. The master recipe is specific, extensive and customized to cover plants supported by the assembly line grow pod 100. By way of example only, the recipe may have instructions to assist 1500 carts simultaneously operating in the assembly line grow pod 100 and carrying diverse population of plants. In some embodiments, the master controller 106 may store specific recipes such as a watering recipe, a nutrient recipe, a dosage recipe, a wave recipe, a temperature recipe, a pressure recipe, etc.

In some embodiments, the master recipe may take any form of a structured set of data, a database, etc. such that data is organized into rows, columns, and table. Additionally, or alternatively, the master recipe may be structured to facilitate the storage, retrieval, modification, addition, and deletion of data through data processing operations.

In some embodiments, the master controller 106 reads information from the master recipe and adjust the information based on known locations of plants at the assembly line grow pod 100. For example, the master controller 106 may identify the plants location based on a cart identifier which is indicative of the growth stage of the plants in the assembly line grow pod 100. Once plants enter into the assembly line grow pod 100, plants move along the spiral tracks from the ascending side to the descending side until plants arrive at the harvest stage. In some embodiments, the location of the carts carrying plants may indicate the growth stage of plants at the assembly line grow pod 100. Then, the master controller 106 may apply the master recipe relevant to the stage of the plants, such as lighting, watering, pressure, and/or wave requirements, specific to plants growing on the fourth day at the assembly line grow pod 100. In other embodiments, different applications of the master recipe to the assembly line grow pod 100 are available.

The master controller 106 processes the master recipe and controls various components of the assembly line grow pod 100. To reduce the processing load, for example, processing the master recipe and all related events for handling a a large number of simultaneously operating carts carrying the diverse population of plants, the master controller 106 may distribute different and specific functions to several control modules, such as a robot controller, a light controller, an environment controller, a dosage controller, a pump controller, etc. These control modules work autonomously, complete task(s) and report to the master controller 106. In some embodiments, the control modules may be configured as hardware modules with their own set of instructions (e.g. proprietary) in order to improve stability and avoid pushed updates and restart/resetting. In other embodiments, other configurations of the control modules available in the relevant art are possible.

In one embodiment, the master controller 106 may work with a valve control module (not shown) which provides control signals to one or more valves 108 and/or receive status signals from the valves 108. Based on these signals, the valve control module can effectively direct the valves 108 to control the flow of fluid to any locations within the assembly line grow pod 100. For example, certain ones of the valves 108 may be fluidly coupled to one or more water lines 110 and may direct water and/or nutrients via the water lines 110 by opening or closing accordingly. Upon completion of tasks, the valve control module sends out a notification to the master controller 106 which in turn updates the relevant information and status.

In another embodiment, the master controller 106 may work with a pump control module (not shown) that provides control signals to one or more pumps 109 and/or receive status signals from the pumps 109. Based on these control signals, the pump control module can effectively direct the one pumps 109 to pump fluid to any locations within the assembly line grow pod 100. Upon completion of tasks, the pump control module sends out a notification to the master controller 106 which in turn updates the relevant information and status.

The water lines 110 may, in conjunction with the valves 108 and/or the pumps 109, may distribute water and/or nutrients to one or more trays 105 at particular areas of the assembly line grow pod 100 when such water and/or nutrients are pumped by the pumps 109. In some embodiments, the valves 108 may also be fluidly coupled to fluid distribution manifolds that distribute the water and/or nutrients via the water lines 110 such that the the amount of fluid that enters the fluid distribution manifolds is controlled by opening or closing the valve 108 and thereby control the pressure of the fluid within the fluid distribution manifolds. In some embodiments, seeds may be sprayed to reduce buoyancy and then flooded. Additionally, water usage and consumption may be monitored, such that, at subsequent watering stations, this data may be utilized to determine an amount of water to apply to a seed at that time, and control of the water may be at least partially completed by the one or more valves.

It should be understood that while the embodiment of FIG. 1 depicts an assembly line grow pod 100 that wraps around a plurality of axes, this is merely one example. The embodiments of the present disclosure are discussed using two towers structure of the assembly line grow pod 100 but the present disclosure is not limited thereto. In other embodiments, four towers structure of the grow pod is available.

Any configuration of assembly line or stationary grow pod may be utilized for performing the functionality described herein.

In some embodiments, various components of the assembly line grow pod 100 may include sensors that detect information relating to plants, seeds, or both with respect to their growth state, their location, contamination, any other factor affecting the assembly line grow pod 100, or its components. For example, weight sensors may be provided to detect weight of plants, weight of payload of carts, etc. The weight sensors may be arranged on the carts, tracks, or at any location suitable for detecting weight of plants. By way of example, the weight sensors may be arranged on the carts to detect weight of plants. As another example, the weight sensors may be located on the tracks. Weight information detected by the weight sensors arranged on the tracks may be provided to the master controller 106. The master controller 106 subtracts the weight of carts from the weight information and determines the weight of plants. In some embodiments, the weight of plants may be used to determine a balanced state of the assembly line grow pod. In other embodiments, the weight of plants may be used for other purposes, such as determining a growth state of plants, tracking a location of seeds, or plants on a tray, determining a location of carts, etc.

In other embodiments, the master controller 106 may estimate the weight of plants. When a particular cart 104 enters into the assembly line grow pod 100, the weight of the particular cart 104 carrying a tray holding seeds at the entry point may be estimated based on the known weight of the cart 104 and the known weight of the tray as well as the amount of seeds known to the system. The master controller 106 contains the master recipe that dictates the amount of fluid to be supplied to seeds and plants. Thus, the amount of fluid supplied to seeds and plants may be known. Based on the set of known information, the master controller 106 may measure a weight of the cart 104 at the harvesting point. For example, the car 104 may stay at a harvesting station before harvesting takes place. This information enables the master controller 106 to estimate the weight of plants.

Figure 2:
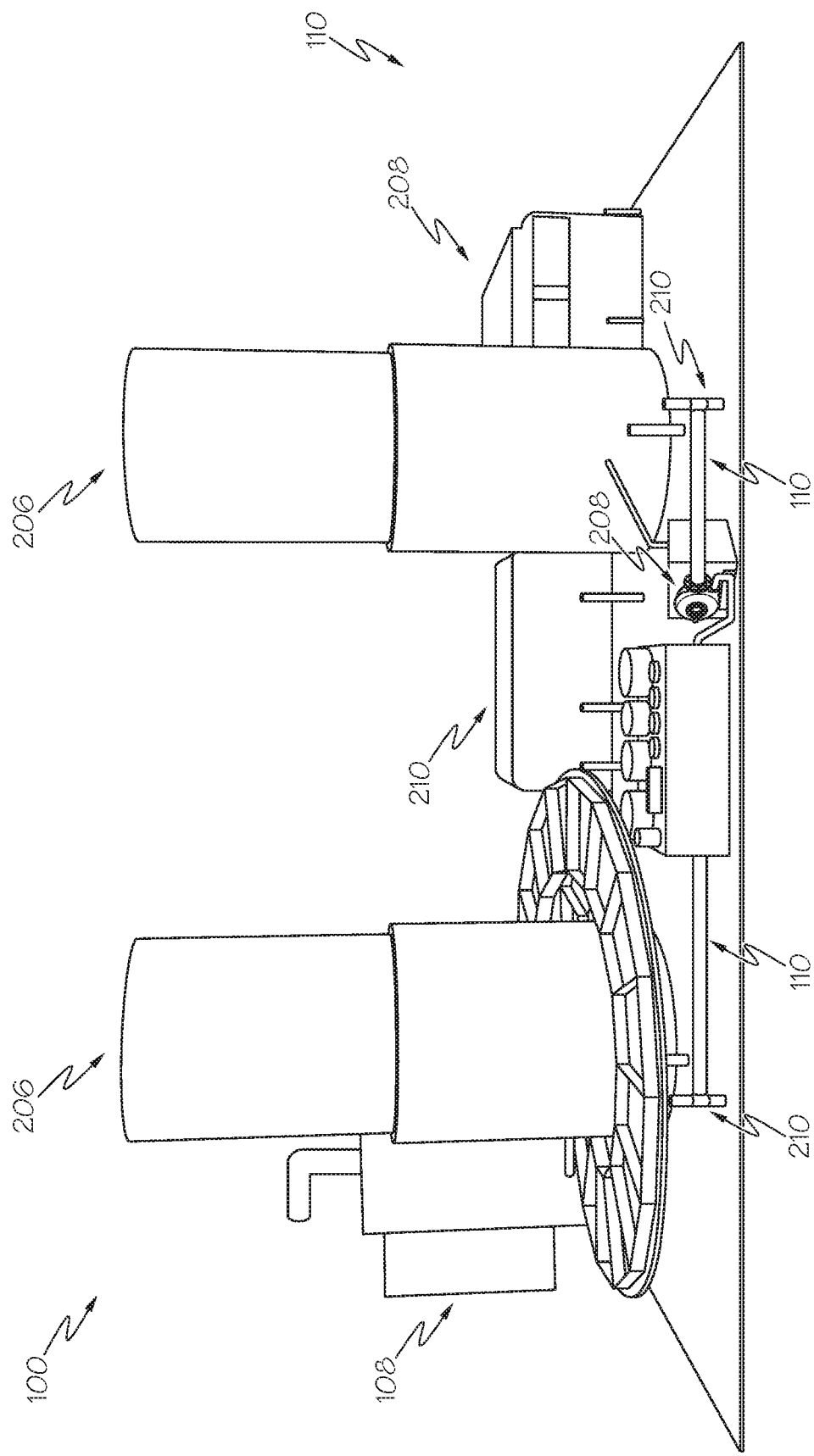
FIG. 2 depicts an assembly line grow pod with tracks removed according to one or more embodiments shown and described herein.

FIG. 2 depicts the assembly line grow pod 100 having a plurality of fluid holding tanks 206 without showing the spiral tracks. The fluid holding tanks 206 include a cycled water portion 206*a*, a gray water portion 206*b*, a nutrient water portion 206*c* and a treated water portion 206*d*. For example, if the sanitizer component 120 requires water to wash the cart 104 and/or the tray 105, a treated water portion 206*d* of the fluid holding tanks 206 provides water to the sanitizer component 120 via the valves 108 which may control movement of the fluid. Gray water contained in the gray water portion 206*b* is also cleaned and recycled water. The fluid holding tanks 206 constantly recycle water to keep water well mixed with nutrients and inject water with oxygen.

Figure 3:
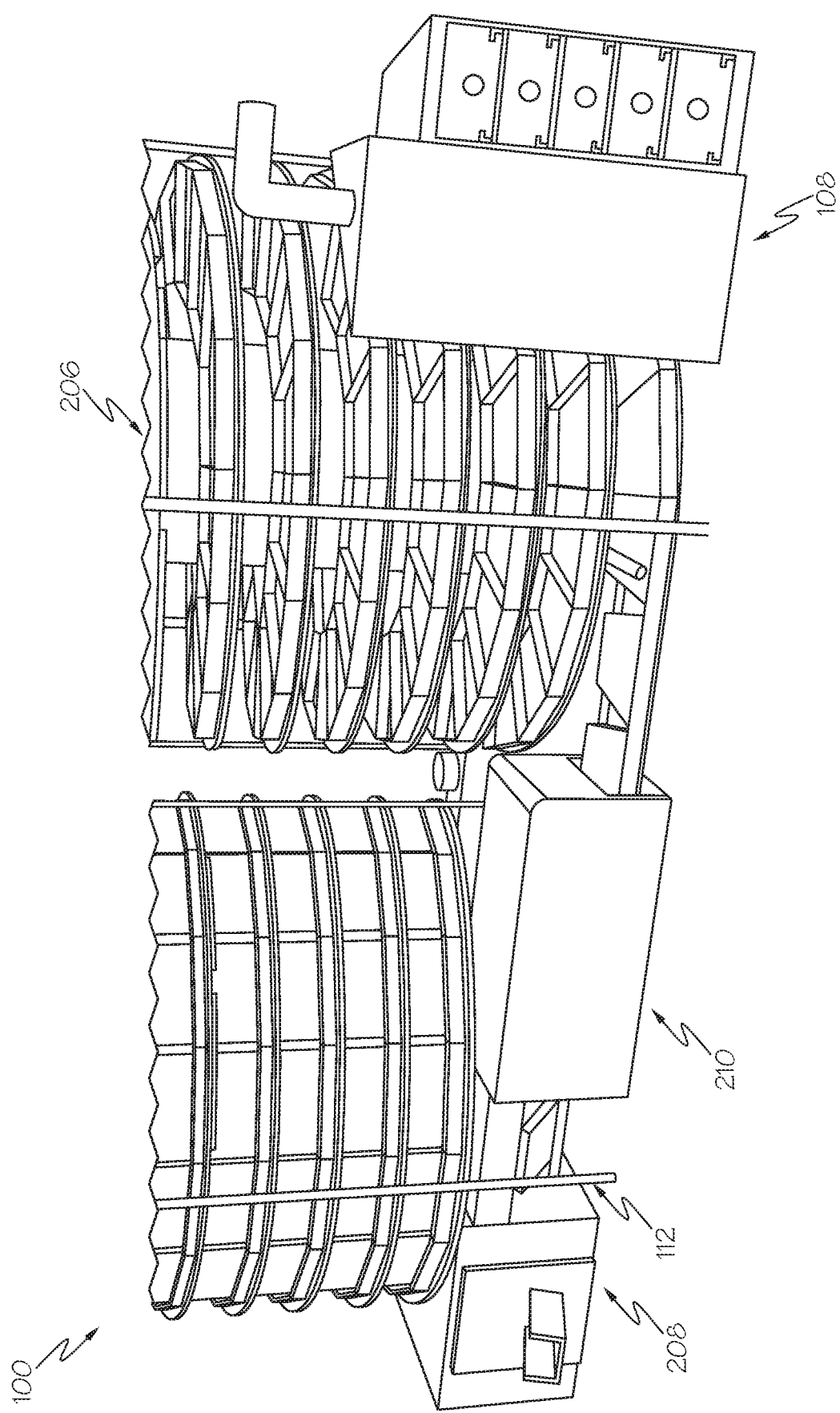
FIG. 3 depicts a rear side of the assembly line grow pod according to one or more embodiments shown and described herein.

FIG. 3 depicts one embodiment of a rear side of the assembly line grow pod 100. Coupled to the master controller 106 is a seeder component 108, as shown in FIGS. 2 and 3. The seeder component 108 may be configured to provide seeds to one or more trays 105 supported by each of the one or more carts 104 as the carts 104 pass the seeder component 108 in the assembly line, as shown in FIG. 3. Depending on the particular embodiment, each cart 104 may include a single section tray for receiving a plurality of seeds. Some embodiments may include a multiple section tray for receiving individual seeds in each section (or cell). In some embodiments, the seeds may be pre-treated with nutrients and/or anti-buoyancy agents (such as water) as these embodiments may not utilize soil to grow the seeds and thus might need to be submerged.

The watering component may be coupled to one or more water lines 110, which distribute water and/or nutrients to one or more trays 105 at predetermined areas of the assembly line grow pod 100. In some embodiments, seeds may be sprayed to reduce buoyancy and then flooded. Additionally, water usage and consumption may be monitored, such that at subsequent watering stations, this data may be utilized to determine an amount of water to apply to a seed at that time.

Also depicted in FIG. 1 are airflow lines 112. Specifically, the master controller 106 may include and/or be coupled to one or more components that delivers airflow for temperature control, pressure, carbon dioxide control, oxygen control, nitrogen control, etc. Accordingly, the airflow lines 112 may distribute the airflow at predetermined areas in the assembly line grow pod 100.

It should be understood that while the embodiment of FIG. 1 depicts an assembly line grow pod 100 that wraps around a plurality of axes, this is merely one example. FIGS. 1 and 2 illustrate two towers structure of the assembly line grow pod 100, but in other embodiments, four towers structure is available. In addition, any configuration of assembly line or stationary grow pod may be utilized for performing the functionality described herein.

FIGS. 2 and 3 depict a plurality of components for an assembly line grow pod 100, according to embodiments described herein. As illustrated in FIGS. 2 and 3, the seeder component 108 is illustrated, as well as a lighting device 206, a harvester component 208, and a sanitizer component 210. As described above, the seeder component 108 may be configured to seed the trays 105 of the carts 104. The lighting devices 206 may provide light waves that may facilitate plant growth. Depending on the particular embodiment, the lighting devices 206 may be stationary and/or movable. As an example, some embodiments may alter the position of the lighting devices 206, based on the plant type, stage of development, recipe, and/or other factors.

Additionally, as the plants are lighted, watered, and provided nutrients, the carts 104 will traverse the track 102 of the assembly line grow pod 100. Additionally, the assembly line grow pod 100 may detect a growth and/or fruit output of a plant and may determine when harvesting is warranted. If harvesting is warranted prior to the cart 104 reaching the harvester, modifications to the master recipe for plant growth may be made for that particular cart 104 until the cart 104 reaches the harvester. In some embodiments, the recipe for plant growth may dictate the timing and wavelength of light, pressure, temperature, watering, nutrients, molecular atmosphere, and/or other variables the optimize plant growth and output. Conversely, if a cart 104 reaches the harvester and it has been determined that the plants in that cart 104 are not ready for harvesting, the assembly line grow pod 100 may commission that cart 104 for another lap. This additional lap may include a different dosing of light, water, nutrients, etc. and the speed of the cart 104 could change, based on the development of the plants on the cart 104. If it is determined that the plants on a cart 104 are ready for harvesting, the harvester component 208 may facilitate such a harvesting process.

In some embodiments, the harvester component 208 may cut the plants at a predetermined height for harvesting. In some embodiments, the tray may be overturned to remove the plants from the tray and into a processing container for chopping, mashing, juicing, etc. Because many embodiments of the assembly line grow pod 100 do not use soil, minimal (or no) washing of the plants may be necessary prior to processing.

Similarly, some embodiments may be configured to automatically separate fruit from the plant, such as via shaking, combing, etc. If the remaining plant material may be reused to grow additional fruit, the cart 104 may keep the remaining plant and return to the growing portion of the assembly line. If the plant material is not to be reused to grow additional fruit, it may be discarded or processed, as appropriate.

Once the cart 104 and tray are clear of plant material, the sanitizer component 210 may be implemented to remove any particulate, plant material, etc. that may remain on the cart 104. As such, the sanitizer component 210 may implement any of a plurality of different washing mechanisms, such as high pressure water, high temperature water, and/or other solutions for cleaning the cart 104 and/or tray. In some embodiments, the tray may be overturned to output the plant for processing and the tray may remain in this position. As such, the sanitizer component 210 may receive the tray in this position, which may wash the cart 104 and/or tray and return the tray back to the growing position. Once the cart 104 and/or tray are cleaned, the tray may again pass the seeder component 108, which will determine that the tray requires seeding and will begin the process of seeding.

In some embodiments, each of the various components of the assembly line grow pod 100 may be controllable by a particular control module that is particularly configured to control the various functions of the associated components. For example, the sanitizer component 210 shown in FIG. 2 may include a control module (not shown) that is particularly configured to control the various functions of the sanitizer component 210. In another example, the harvester component 208 may include a control module that is particularly configured to control the various functions of the harvester component 208, as shown in FIG. 2. It should be understood that a control module may also control a plurality of components or may control only a portion of a component.

Figure 4:
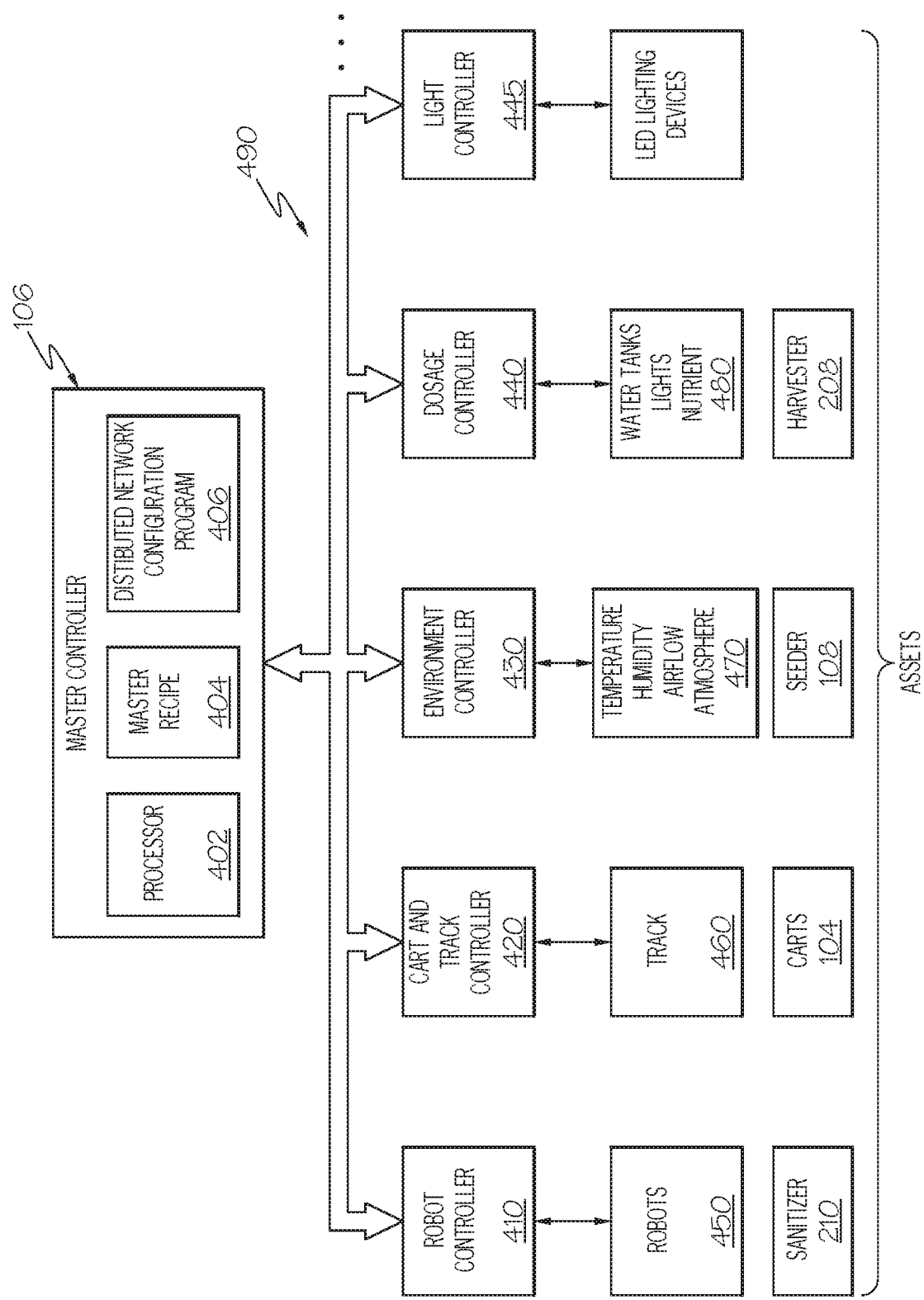
FIG. 4 depicts a block diagram of a distributed control system for use in an assembly line grow pod, according to one or more embodiments shown and described herein.

FIG. 4 illustrates a block diagram of a distributed control system 400 for use with the assembly line grow pod according to various embodiments. In FIG. 4, the master controller 106 and various control modules such as a robot controller 410, a cart and track controller 420, an environment controller 430, a dosage controller 440 (referred to as a nutrient controller), and a light controller 445 are included in the distributed control system 400. These controllers are by way of example only and the distributed control system is not limited thereto. As shown in FIG. 4, each controller is associated with relevant assets of the assembly line grow pod 100. Such assets include robots, valves, carts, water pumps, air pumps, water lines, water tanks, air lines, water lines, lighting devices, various components of the assembly line grow pod 100 such as the sanitizer 210, the seeder 108, the harvester 208 as discussed above in connection with FIGS. 2 and 3. In some embodiments, the assets further include plants and seeds which are in the growing process at the assembly line grow pod 100.

The distributed control system 400 is implemented in consideration of efficient and optimal use of the assets. For example, the master controller 106 stores a master recipe 404 relevant to plants carried by, for example, 1500 carts which are simultaneously operating at the assembly line grow pod 100. There are numerous pumps, valves, watering robots, etc. and various components that require control. The distributed control system 400 is implemented to distribute control functions between the master controller 106 and various control modules in light of these assets. As shown in FIG. 4, various control modules may include the robot controller 410, the cart and track controller 420, the environment controller 430, the dosage controller 440 and the light controller 445 in some embodiments. The robot controller 410 is configured to perform control functions relating to robots 450. Robots 450 may include watering robots and perform watering over plants throughout the entire space of the assembly line grow pod 100. The cart and track controller 420 is configured to perform control functions relating to carts 104 and tracks of the assembly line grow pod 100. The environment controller 430 is configured to perform control functions relating to temperature, relative humidity, air flow, and atmosphere (Oxygen and $CO_2$ rates). The dosage controller 440 is configured to perform control functions relating to a dosage supply such as watering, nutrient feeds, etc. The light controller 445 is configured to perform control function relating to lighting systems such as LED lighting systems, customizing light spectrums based on plants' needs.

Operations and functions of the robot controller 410, the cart and track controller 420, the environment controller 430, the dosage controller 440 and the light controller 445 are further discussed in detail below. The operation of the pump control module is discussed in copending U.S. application Ser. No. 15/965,163, filed on Apr. 27, 2018, and claiming benefit of U.S. Provisional Application No. 62/519,428, filed on Jun. 14, 2017 and entitled, "DEVICES, SYSTEMS, AND METHODS FOR PROVIDING AND USING A PUMP CONTROL MODULE IN A MASTER CONTROLLER IN AN ASSEMBLY LINE GROW POD," disclosure of which is incorporated herein by entirety.

In the distributed control system 400 as shown in FIG. 4, the master controller 106 delegates and distributes various functions to other control modules, such as the robot controller 410, the cart and track controller 420, the environment controller 430, the dosage controller 440 and the light controller 445 in light of assets available and operating in the assembly line grow pod 100. These controllers 410, 420, 430, 440 and 445 handle control functions of relevant components and assets. Once delegated and distributed, the control functions handled by these controllers 410, 420, 430, 440 and 445 are independent of the master controller 106 and autonomous. Once the delegated tasks are completed, the controllers 410, 420, 430, 440 and 445 report completion of tasks to the master controller 106 and the relevant record and data are updated in the master controller 106.

The controllers 410, 420, 430, 440 and 445 are communicatively coupled to the master controller 106. As one example, the controllers 410, 420, 430, 440 and 445 are coupled to the master controller 106 via a wired connection. The wired connection may include a plug and play network 490 requiring no addressing setup. The distributed control system 400 allows the master controller 106 and the controllers 410, 420, 430, 440 and 445 to be connected over one common communication protocol. In some embodiments, one or more of the controllers 410, 420, 430, 440 and 445 may be plugged-in and substantially simultaneously connected with the master controller 105. Similarly, one or more of the controllers 410, 420, 430, 440 and 445 may be plugged out and disconnected from the master controller 106. Once the wired connection may be made, the master controller 106 may identify each controller 410, 420, 430, 440 and 445 with their unique addresses, for example, based on physical locator(s). In other embodiments, the controllers 410, 420, 430, 440 and 445 may be wirelessly coupled to the master controller 106.

In some embodiments, the distributed control system 400 operates over a proprietary network. The communication channel 490 may be the proprietary network. Moreover, in some embodiments, operating systems of the master controller 106 are using proprietary programming language developed by Assignee of the present application, Grow Solutions Tech LLC. This proprietary nature of the distributed control system 400 may be helpful in providing improved security and substantially zero downtime of the assembly line grow pod 100 because the distributed control system 400 may not be subject to resetting, shutting down and restarting initiated and pushed by commercially available software and operating systems. In other words, operation and maintenance of the network 490, upgrade, reconfiguration, repair, and replacement of the master controller 490 and other controllers 410, 420, 430, 440 and 445 may be scheduled and/or controlled completely based on the need and requirements of the assembly line grow pod 100.

In some embodiments, the distributed control system 400 may be implemented using edge computing technology. The master controller 106 and various controllers 410, 420, 430, 440 and 445 may reside away from centralized computing systems available in the cloud. Instead, the distributed control system 400 may be arranged close to source of data, i.e., within or adjacent to the assembly line grow pod 100. Accordingly, data gathering and collection and analysis of data may occur at the location where source of data are present. This capability and characteristics of the distributed control system 400 may be valuable and/or indispensable to the assembly line grow pod 100. The assembly line grow pod 100 may generate a large amount of data with numerous variables and require fast, seamless and customized responses based on the growth patterns/growth results of plants. Advantages of implementing the distributed control system 400 with edge computing may include reduction of unplanned downtime, improvement in asset performance, lower cost of maintenance, no need to transport back and forth data to/from the cloud, system configuration flexibility, etc. Such advantages may be highly relevant and valuable to operation of the assembly line grow pod 100.

In some embodiments, the distributed control system 400 is a proprietary system and uses its own operating systems for operating the assembly line grow pod 100. In other embodiments, the distributed control system 400 may transport data to a cloud system if needed and as needed. As the assembly line grow pod 100 continues to operate, a large amount of data may be accumulated and onsite storage may no longer be the best option. The cloud system may be used for data storage purpose, or other purposes.

Figure 5:
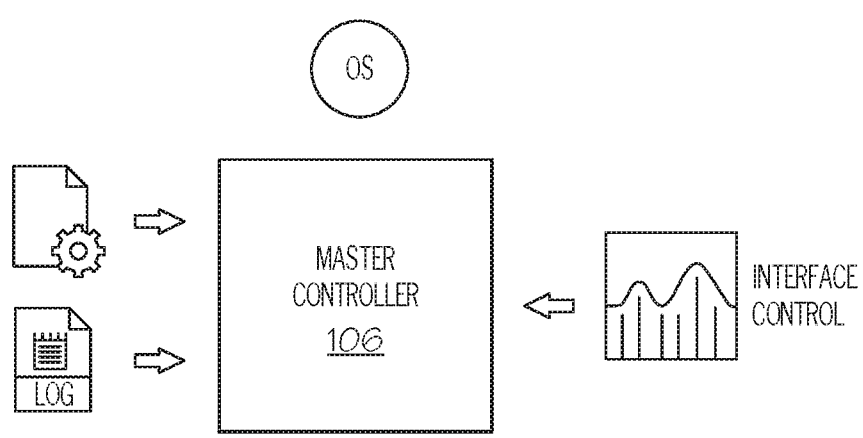
FIG. 5 depicts illustrative operations of a master controller of a distributed control system for use in an assembly line grow pod, according to one or more embodiments shown and described herein.

FIG. 5 depicts an illustrative block diagram of the master controller 106. As discussed above, the master controller 106 stores the master recipe 404. In some embodiments, the master recipe is designed using proprietary programming language for a specific plant. Each recipe includes the following commands: HVAC (TEMPERATURE, HUMIDITY, AIRFLOW), LIGHT (RED, BLUE, WARM, COOL, UV), WATER, TIMER, DOSER, CYCLE, BREAK, EXIT, ALERT, etc. The commands listed here are for exemplary purposes and commands for the master recipe are not limited thereto. The HVAC command changes environmental variables such as temperature, humidity, airflow, etc. The LIGHT command specifies lights to be turned on. For example, the LIGHT command may specify usage of different lights, such as red, blue, warm, or cool lights. The WATER command is used to control the watering. The WATER command specifies a tank that watering is to draw from to perform watering. The WATER command further specifies a number of seconds that watering devices will be turned on. The operation duration of watering devices may be controlled by using the TIMER command. The DOSER command is used to add specific nutrients into a tank specified by the WATER command. The DOSER command specifies the amount of nutrients as well. The CYCLE command specifies a set number of loops for designated commands. For example, the CYCLE command may designate turning on a red light for 75 seconds twelve times. The BREAK command stops the looping cycle and the EXIT command stops execution. The ALERT command sends a message to notify predetermined operators or users and does not stop or halt the program.

In some embodiments, the master recipe 404 is configured to cover different growing environments, such as from a small single tray to a large number of grow pods covering thousands of acres. This is because the master recipe 404 can be configured to define each recipe for a specific plant as needed. Once recipes are set up, recipes may be emulated in a customized test chamber to determine whether recipes work. During this emulation process, adjustment to recipes may be made and the emulation process is repeated until recipes are tested to work. Once recipes have been completed, they are exported to a larger pod operating system. The pod operating systems are proprietary in its nature and not subject to external push upgrade, modifications, or reconfiguration. The pod operating systems run one common communication protocol to facilitate communications with other controllers as shown in FIG. 4.

Figure 6A:
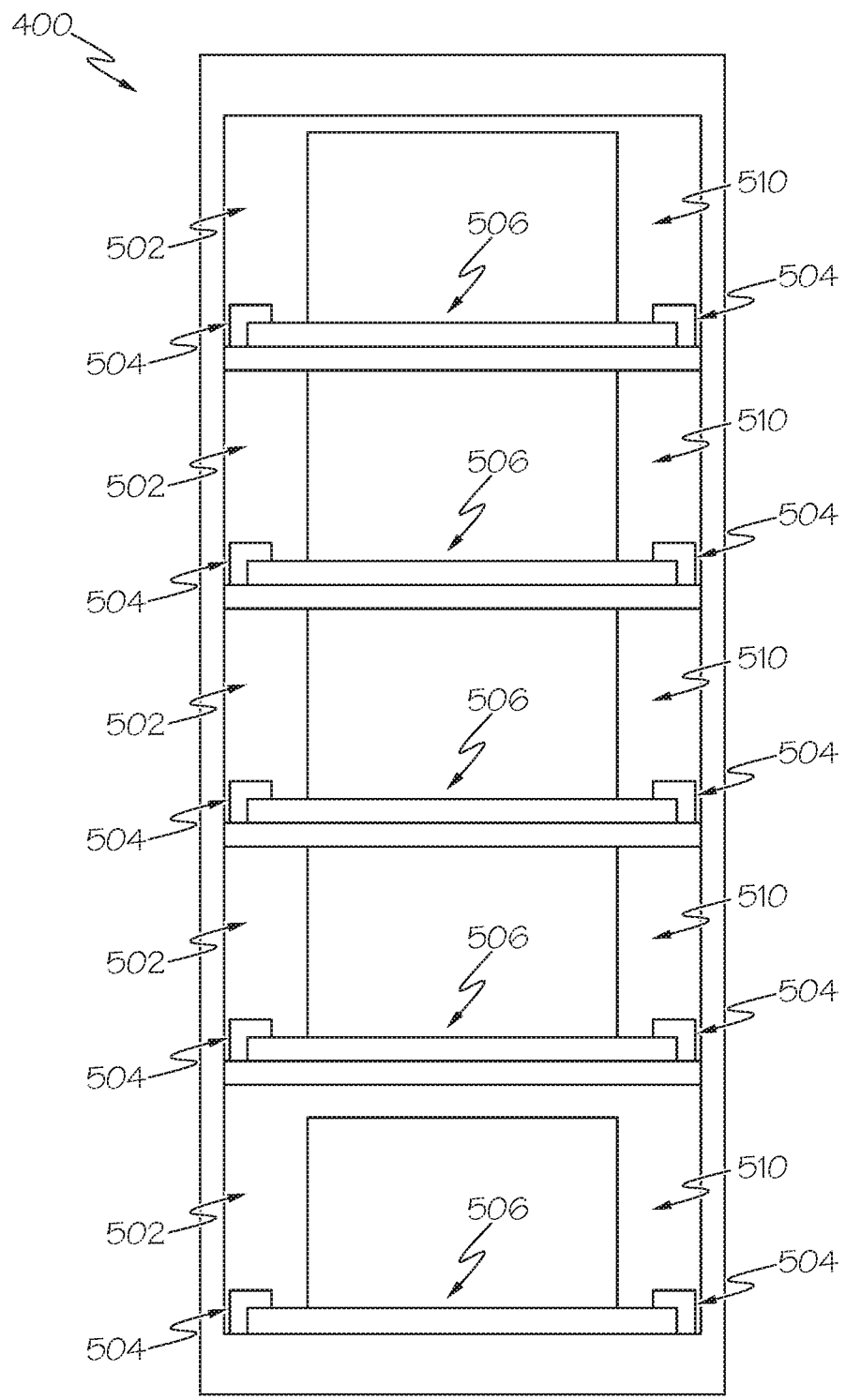
FIG. 6A depicts an illustrative modular interface of a distributed control system according to one or more embodiments shown and described herein.
Figure 6B:
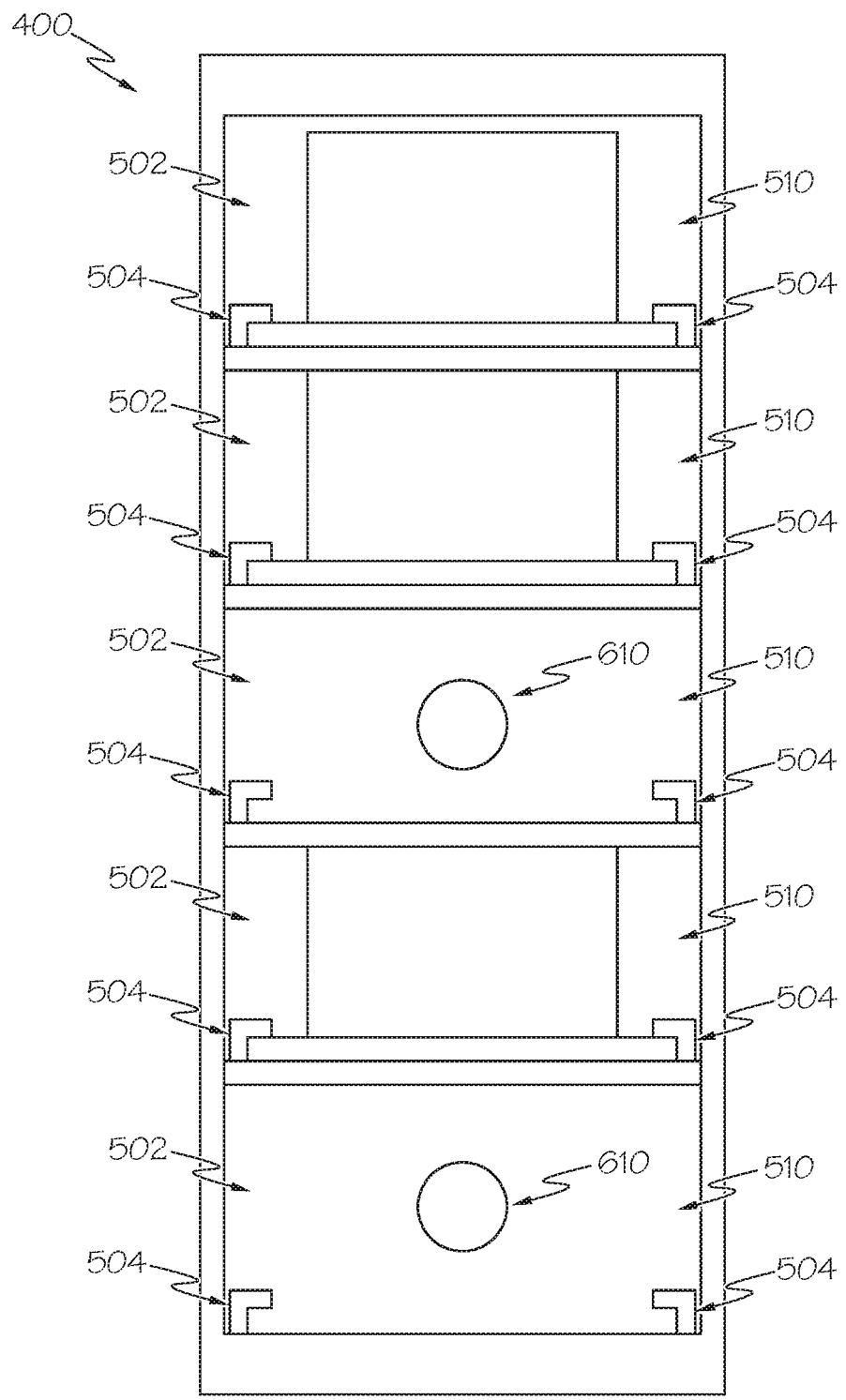
FIG. 6B depicts another illustrative modular interface of a distributed control system according to one or more embodiments shown and described herein.
Figure 6C:
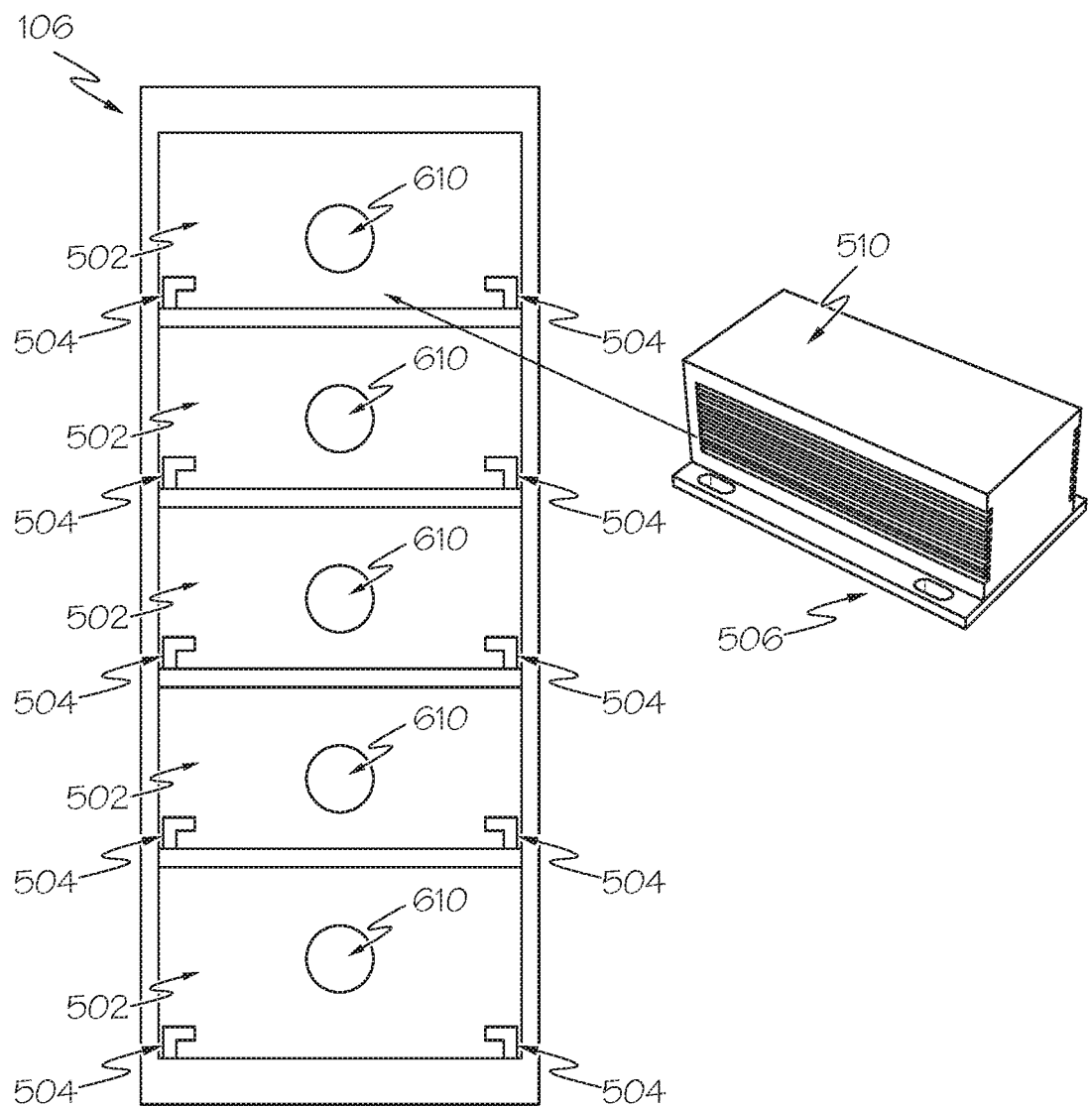
FIG. 6C depicts another illustrative modular interface of a distributed control system for receiving a hardware controller according to one or more embodiments shown and described herein.

FIGS. 6A-6C depict illustrative configurations of a housing of the distributed control system 400 according to various embodiments. As shown in FIG. 6A, the distributed control system 400 includes the housing that houses the master controller 106 and various control modules. The housing facilitates connection between the master controller 106 and various control modules such as a plug and play network. The housing further facilitates simple and convenient placement and removal of various control modules.

The distributed control system 400 has a modular control interface that can support a plurality of the control modules 510. The control modules 510 may be configured to perform as the robot controller 410, the cart and track controller 420, the environment controller 430, the dosage controller 440 and the light controller 445, as shown in FIG. 4. As such, the housing of the distributed control system 400 may include a plurality of bays 502 in which each control module 510 can be placed. Each bay 502 is generally a cavity within the distributed control system 400 that is sized and shaped to receive any one of the control modules 510. In addition, each bay 502 may have a similar shape and size as the other bays 502 of the master controller 106 such that any control module 510 can be inserted in any bay 502. That is in some embodiments, no bay 502 is particularly shaped to only accept a certain control module 510.

Each of the plurality of bays 502 may further include a support mechanism 504. The support mechanism 504 may be a rail or the like that supports the corresponding support 506 on the control module 510. In addition, the support mechanism 504 may also act as a guide to ensure that the control module 510 is appropriately inserted and positioned within the bay 502.

Referring to FIG. 6B, each of the plurality of bays 502 may further include a bay I/O port 610. The bay I/O port 506 may correspond to the I/O port 808 (FIG. 7A) on the control module 510 such that the bay I/O port 506 and the I/O port 808 (FIG. 7A) on the control module 510 can be matingly coupled together. Moreover, the bay I/O port 506 may contain various communications components such that, when the bay I/O port 506 is mated to the I/O port 808 (FIG. 7A) on the control module 510, communications between the control module 302 and external devices communicatively coupled via the bay I/O port 506 can occur. In some embodiments, the control module 510 may be coupled to a cable connected to the master controller 106, for example, via a plug-in connection mechanism and begin communications with the master controller 106. When the cable is connected to the control module 510, the master controller 106 may pick up the address of the control module 501 right away. Similarly, when the control module 510 may be plugged out from the bays 502, for example, by disconnecting the cable, then the control module 510 may be disconnected from the master controller 106.

Since each of the bays 502 are similar in shape and size and contain the same components (i.e., support mechanisms 504 and bay I/O ports 506), any control module 510, regardless of functionality, may be placed in any one of the bays 502 in order to operate. Certain bays 502 may contain a control module 510 that is operating to control one or more functions of the assembly line grow pod 100 (FIG. 1) while other bays 502 may remain vacant and ready to accept a control module 510, as depicted in FIG. 6B.

In addition, the master controller 106 is configured such that it allows the control modules 510 to be hot swappable. That is, each control module 510 can be inserted into a bay 502 of the master controller 106 at any time to function. Furthermore, removal of control modules 510 from a bay 502 do not alter the functionality other control modules 510 inserted in other bays 502. As such, a user may remove a particular control module 510 from a bay 502 at any time without altering the functionality of the remaining installed control modules 510. This may be particularly useful in situations where it may be necessary to remove a control module 510 from a bay 502 without shutting down the entire assembly line grow pod 100 (FIG. 1) to do so. It should be understood that a particular control module 510 may be removed from a bay 502 for any number of reasons. For example, a control module 510 may be removed from a bay 502 for repairs, upgrades, to switch one control module 510 for another control module 510 (i.e., a control module that provides different functionality), and/or the like. In addition, the hot swappable capabilities of the control modules 510 allow for many different control modules to be built to particular specifications depending on a particular use of the assembly line grow pod 100 (FIG. 1) or a component thereof such that the functionality of each assembly line grow pod 100 can be particularly customized precisely to desired specifications.

In some embodiments, the master controller 106 may further include ducts, fans, and/or the like that are used to cool the various control modules 510 while they are operating to avoid heat related damage to the control modules 510. The thermal energy generated by the control modules 510 during operation may be captured and/or used to provide heated air to various portions of the assembly line grow pod 100 (FIG. 1), such as in instances where certain seeds and/or plants need a heated atmosphere for optimal grow conditions. The thermal energy may also be converted into electrical energy that can be used to power the various components of the assembly line grow pod 100 (FIG. 1).

In some embodiments, the master controller 106 may be removed from the assembly line grow pod 100 for some reasons, such as repair, upgrade, replacement, etc. As shown in FIG. 4, various controllers 410, 420, 430, 440 and 445 are configured to perform distributed control functions and operating. The network supporting and connecting the master controller 106 and various controllers 410, 420, 430, 440 and 445 may be the plug and play network 490 requiring no address setup and conducts self-diagnostics and error correction. This network 490 allows for many different hardware devices to be connected over one common communication protocol. Even if the master controller 106 may be removed, such removal may not affect the operation of the control functions of the controllers 410, 420, 430, 440 and 445. When the master controller 106 is reconnected, the controllers 410, 420, 430, 440 and 445 may report the completed tasks and update the master controller 106 with respect to each control function delegated to the controllers 410, 420, 430, 440 and 445. This aspect of the distributed control system may improve flexibility and reliability of the distributed control system 400.

While FIGS. 6A-6C depict the distributed control system 400 having the housing equipped with five vertically arranged bays 502 for receiving control modules 510, this is merely illustrative. That is, it should be understood that the housing of the distributed control system 400 may have any number of bays 502 and may be further arranged in any configuration without departing from the scope of the present disclosure.

For example, as depicted in FIG. 6C, each of the support mechanisms 504 in each bay 502 accepts the corresponding support 506 on the control module 510 such that the control module 510 slides into the bay 502 in the correct positioning. Once the control module 510 slides in the boy 502, it may be connected to a plug and play network such as the network 490 in FIG. 4. It should be understood that the particular arrangement and configuration of the support mechanisms 504 and the supports 506 are merely illustrative, and other means of ensuring that the control module 510 is appropriately placed within the bay 502 are possible without departing from the scope of the present disclosure.

Figure 7A:
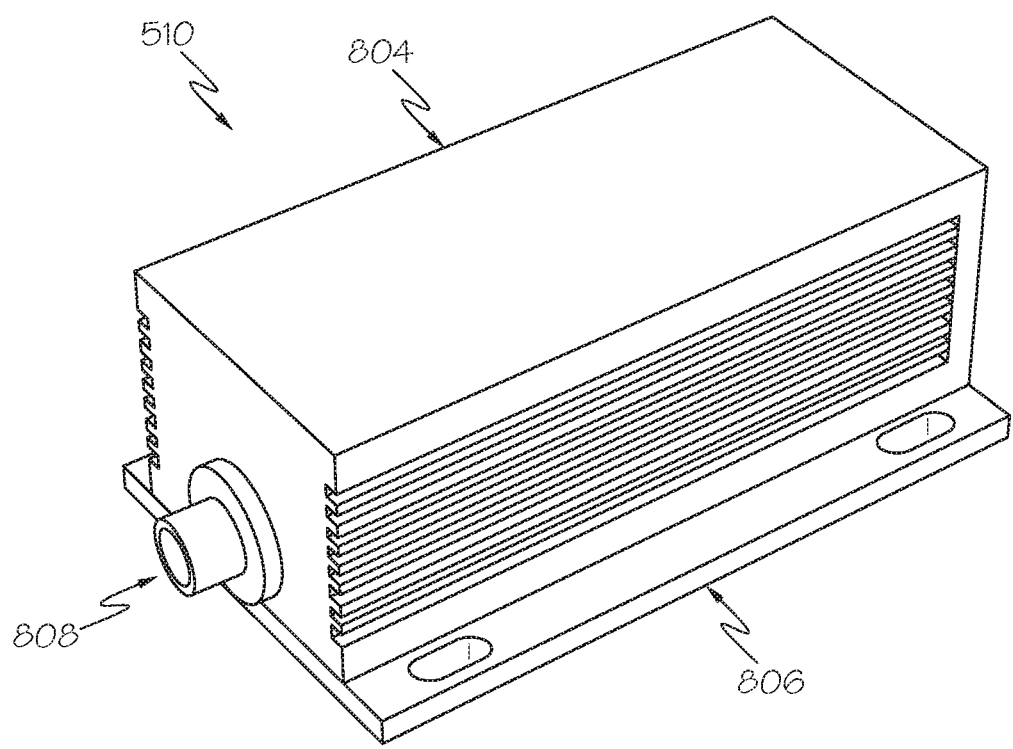
FIG. 7A depicts a perspective view of a hardware controller according to one or more embodiments shown and described herein.

FIG. 7A depicts an illustrative control module 510 according to various embodiments. The control module and the controller may be interchangeably used in the embodiments described herein. The control module 510 may include a housing 804 coupled to a support 806. The support 806 may support the housing 804 within a master controller unit, as described in greater detail herein. The control module 510 may further include an I/O port 808 within the housing 804. The I/O port 808 may be a communications port or the like that contains circuitry and mechanical coupling components that allow various components within the control module 510 to communicate with devices external to the control module 510, as described in greater detail herein. The control module 510 is by way of one example and the present disclosure is not limited thereto. In other embodiments, different shapes and configurations of a control module are available.

As shown in FIG. 7B, the control module 510 may be configured as a hardware control module. As discussed above in connection with FIG. 4, the control module 510 includes a computing device and independently operates. This hardware configuration of the control module 510 may provide reliability to the assembly line grow pod 100. For example, the control module 510 may not be subject to a pushed upgrade, interruption due to software replacement or upgrade, etc. As another example, the control module 510 may not be subject to pushed resetting, or restarting of the system which may affect the operation of the assembly line grow pod 100. As discussed above, the network 490 where the control module 510 is connected and the common communication protocol is in use, may be proprietary. The control module 510 may not be subject to external software upgrade, external, or pushed interruption of the performance, etc.

Moreover, the hardware control module as shown in FIG. 7A may provide a simple and convenient mechanism for expansion, replacement, repair and upgrade. For example, if the cart and track controller 420 requires replacement, any hardware control module available at the assembly grow line pod 100 may be used to be configured as another cart and track controller 420. There is no need to wait to receive any shipment from a system provider. Any hardware control module may be used to be programmed to perform distributed functions, i.e., cart and track control functions, replacing the old controller 410, plugged into the bay structure 502 and connected to the distributed control system 400 via the plug and play network 490. This flexibility may facilitate and ensure continuous and reliable operations of the assembly line grow pod 100 which may be indispensable for growing plants.

In some embodiments, the distributed control system 400 may consider assets available in the assembly line grow pod 100 and make a determination of distributing and delegating control functions based on the assets and/or the processing load on the master controller 106. Once such determination is made, hardware control module(s) may provide flexibility that facilitates programming the distributed and delegated control functions and setting up as control module(s) to perform the distributed and delegated control functions. Such configuration and programming may not need to consider requirements and compatibility with commercial available programs and operating systems such as Microsoft Windows®.

In some embodiments, the control module 510 may be configured to perform operations and functions of various components for use in the assembly line grow pod. In one embodiment, as described in copending U.S. patent application Ser. No. 15/926,771 and U.S. Provisional Application No. 62/519,420, the control module 510 may be implemented as a crop control module. In further another embodiment, as described in copending U.S. application Ser. No. 15/965,163 and U.S. Provisional Application No. 62/519,428, the control module 510 may be implemented as a pump control module.

As discussed in FIG. 4, the control module 510 may be configured as the robot controller 410, the cart and track controller 420, the environment controller 430, the dosage controller 440 and the light controller 445. The robot controller 410 may control operations of robots 450. These robots 450 may include watering robots. The robot controller 410 controls operations of the robots 450 based on parameters received from the master controller 106 via connection 415. The robot controller 410 autonomously operates and is independent of the control of the master controller 106 within the scope of control functions delegated by the master controller 106. For instance, if one or two robots stop operation and need to be replaced, the robot controller 410 may make a decision to replace such robots and ensure that operations of the rest of robots are not affected.

Figure 8:
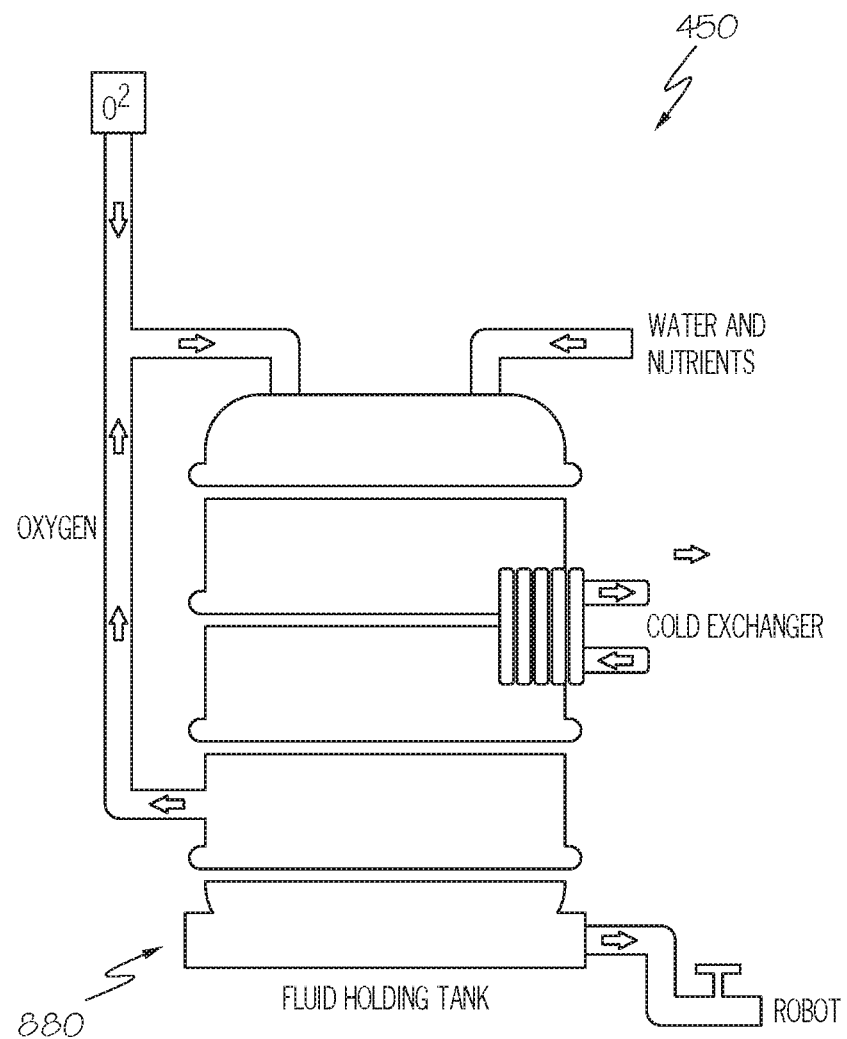
FIG. 8 depicts an illustrative fluid holding tank for use in an assembly line grow pod according to one or more embodiments shown and described herein.

FIG. 8 depicts exemplary components relating to operation of robots 450 controlled by the robot controller 450. As discussed above, the robots 450 may include watering robots. As shown in FIG. 8, the robots 450 may be coupled to a fluid holding tank 880. The tank 880 constantly recycles water to keep water well mixed with nutrients and inject water with oxygen, as shown in FIG. 8. In some embodiment, a cold exchange as shown in FIG. 8 keeps water at 5 degrees less than the ambient environment. The robots 450 are coupled to the fluid holding tank 880 in order to supply fluid. As one example, watering robots can water over 50,000 locations with as little as 0.075 milliliters per location in any given tray in the assembly line grow pod 100. In some embodiment, this watering occurs as a droplet of water rather than pressurized spray to decrease the amount of back splash on equipment.

In other embodiments, the control module 510 may operate as the cart and track controller 420, the environment controller 430, the dosage controller 440 and the light controller 445. The cart and track controller 420 controls movement of the carts 104 on the track such as staying or moving of carts 104 from entering of the carts into the assembly line grow pod 100 to the harvesting stage of plants. In some embodiments, the carts 104 may be assigned with unique identifiers and the cart and track controller 420 may receive these identifiers and provide to the master controller 106 along with another set of information from the carts 104 such as weight of carts 104 with plants grown, the amount of seeds present on trays carried by the carts, type of plants carried by carts 104, etc. In addition, the cart and track controller 420 may detect the particular location of carts 104 at the assembly line grow pod 100. In some embodiments, the cart and track controller 420 controls inventory of carts. For example, if one cart is out of order, the cart and track controller 420 determines whether there is a replacement cart, whether or not repair the cart out of order, whether or not to request a new cart, etc.

The light controller 445 controls a LED lighting system which provides different light wave-length colors customized to plants. The detailed explanations of the LED lighting system available in the assembly line grow pod can be found in copending U.S. application Ser. No. 15/949,432 filed Apr. 10, 2018, claiming priority to Provisional Application No. 62/519,607 filed Jun. 14, 2017 and entitled as "SYSTEMS AND METHODS FOR UTILIZING LED RECIPES FOR A GROW POD." The light controller 445 controls operation and duration of LED lighting systems such that plants will be exposed to different light wave-length color based on the recipe relating to the lighting, as discussed above in connection with the LIGHT command from the master recipe. The operations of the dosage controller 440 will be further discussed in detail below in connection with FIG. 10.

Referring back to FIG. 7B, various internal components of the illustrative control module 510 are illustrated. In some embodiments, such internal components may generally be a computing environment. As illustrated, control module 510 may include a computing device 720. The computing device 720 includes a processor 730, input/output hardware 732, the network interface hardware 739, a data storage component 736 (which stores systems data 738*a*, plant data 738*b*, and/or other data), and the memory component 990. The memory component 790 may be configured as volatile and/or nonvolatile memory and as such, may include random access memory (including SRAM, DRAM, and/or other types of RAM), flash memory, secure digital (SD) memory, registers, compact discs (CD), digital versatile discs (DVD), and/or other types of non-transitory computer-readable mediums. Depending on the particular embodiment, these non-transitory computer-readable mediums may reside within the computing device 720 and/or external to the computing device 920.

The memory component 790 may store operating logic 792, systems logic 744*a*, and the plant logic 744*b*. The systems logic 744*a* and the plant logic 744*b* may each include a plurality of different pieces of logic, each of which may be embodied as a computer program, firmware, and/or hardware, as an example. As described in more detail below, the systems logic 744*a* may monitor and control operations of one or more of the components of the assembly line grow pod 100 (FIG. 1). The plant logic 744*b* may be configured to determine and/or receive a recipe for plant growth and may facilitate implementation of the recipe via the systems logic 744*a*.

The operating logic 742 may include an operating system and/or other software for managing components of the computing device 720. As also discussed above, systems logic 744*a* and the plant logic 744*b* may reside in the memory component 740 and may be configured to perform the functionality, as described herein.

In some embodiments, the control module 510 may include the dosage controller 440, as shown in FIG. 4. The systems logic 744*a* and the plant logic 744*b* are programmed to perform the necessary dosage functionality needed to operate the assembly line grow pod. That is, the amount of fluid, the type of fluid (e.g., water, nutrients, etc.), the location as to where the fluid is to be pumped, the various components that are to be used to control dosage, and/or the like may be considered in determining the desired fluid provision functionality. The dosage controller 440 is configured and connected with the master controller 106 via the housing of the distributed control system 400, as shown in FIGS. 6A, 6B and 6C. An input is received regarding a dosage to be provided to a seed and/or a plant. In some embodiments, the input may be an input relating to a particular type of seed and/or plant or an input from a recipe and the dosage controller 440 may determine the dosage accordingly. Then, the systems logic 744*a* of the dosage controller 440 is programmed to determine which components are needed to provide the appropriate dosage and what settings are needed for each component. Then the dosage controller 440 sends one or more signals to the various components to adjust accordingly and provide the appropriate dosage. Thus, the dosage controller 440 determines appropriate dosage for plants or seeds based on input and controls relevant components to provide the determined dosage.

It should be understood that while the components in FIG. 7B are illustrated as residing within the computing device 720, this is merely an example. In some embodiments, one or more of the components may reside external to the computing device 720. It should also be understood that, while the computing device 720 is illustrated as a single device, this is also merely an example. In some embodiments, the systems logic 744*a* and the plant logic 744*b* may reside on different computing devices. As an example, one or more of the functionalities and/or components described herein may be provided by a user computing device and/or a remote computing device.

Additionally, while the computing device 720 is illustrated with the systems logic 744*a* and the plant logic 744*b* as separate logical components, this is also an example. In some embodiments, a single piece of logic (and/or or several linked modules) may cause the computing device 720 to provide the described functionality.

A local interface 746 is also included in FIG. 7B and may be implemented as a bus or other communication interface to facilitate communication among the components of the computing device 720.

The processor 730 may include any processing component operable to receive and execute instructions (such as from a data storage component 736 and/or the memory component 790). The input/output hardware 732 may include and/or be configured to interface with microphones, speakers, a display, and/or other hardware.

The network interface hardware 739 may include and/or be configured for communicating with any wired or wireless networking hardware, including an antenna, a modem, LAN port, wireless fidelity (Wi-Fi) card, WiMax card, ZigBee card, Bluetooth chip, USB card, mobile communications hardware, and/or other hardware for communicating with other networks and/or devices. From this connection, communication may be facilitated between the computing device 720 and other devices external to the control module 510. As such, the network interface hardware 739 may be communicatively coupled to the I/O port 808 of the control module 510.

In some embodiments, the control module 510 may be coupled to a network. The network may include the internet or other wide area network, a local network, such as a local area network, a near field network, such as Bluetooth or a near field communication (NFC) network. Various other control modules, other computing devices, and/or the like may also be coupled to the network. Illustrative other computing devices include, for example, a user computing device and a remote computing device. The user computing device may include a personal computer, laptop, mobile device, tablet, server, etc. and may be utilized as an interface with a user. As an example, a user may send a recipe to the computing device 720 for at least a partial implementation by the control module 510. Another example may include the control module 510 sending notifications to a user of the user computing device.

Similarly, the remote computing device may include a server, personal computer, tablet, mobile device, etc. and may be utilized for machine to machine communications. As an example, if the assembly line grow pod 100 (FIG. 1) determines a type of seed being used (and/or other information, such as ambient conditions), the computing device 720 may communicate with the remote computing device to retrieve a previously stored recipe for those conditions. As such, some embodiments may utilize an application program interface (API) to facilitate this or other computer-to-computer communications.

Figure 9:
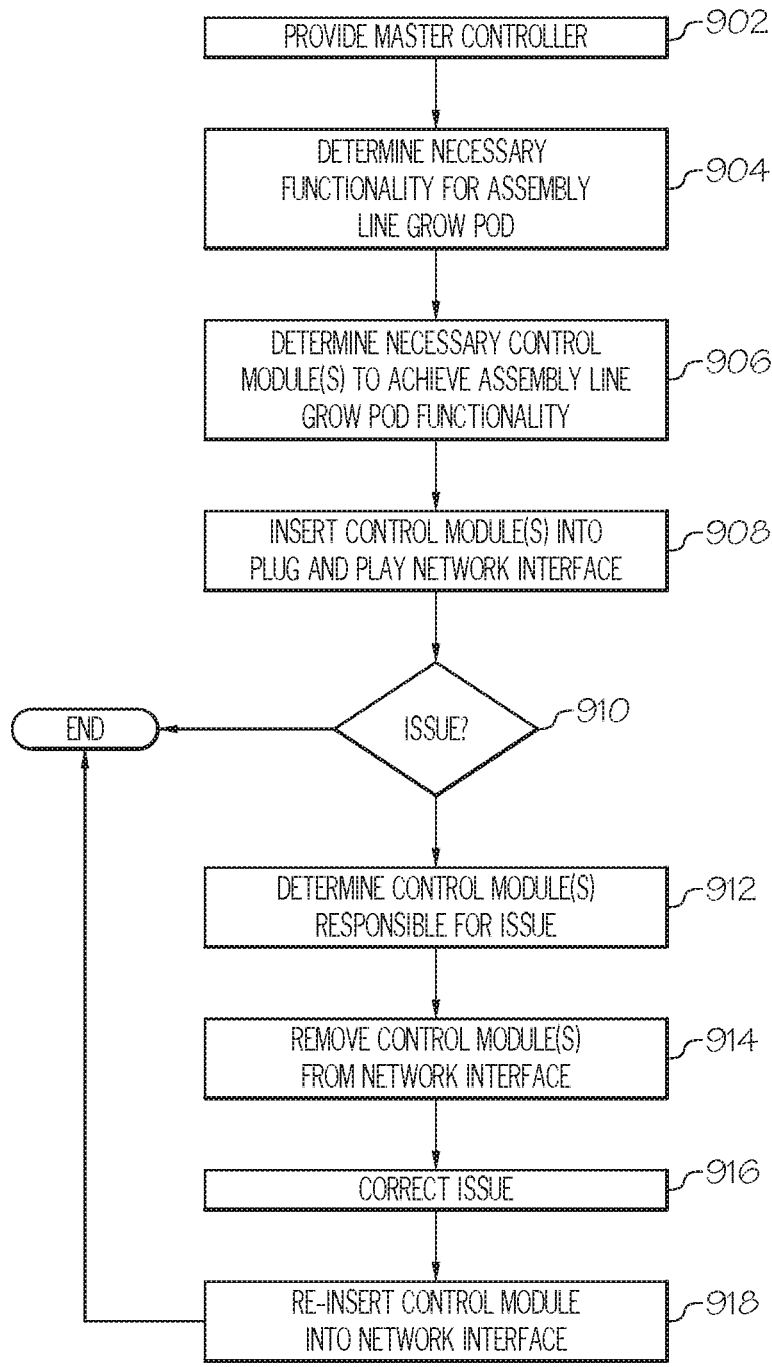
FIG. 9 depicts a flow diagram of an illustrative method of providing a distributed control system according to one or more embodiments shown and described herein.

FIG. 9 depicts a flowchart of providing a distributed control system according to various embodiments. As shown in FIG. 9, the method includes providing the master controller in block 902. As discussed above, the master controller 106 stores and manages the master recipe that includes a set of plant growing instructions or commands. Based on the master recipe 404, the master controller 106 controls supply of fluid, lighting, air flow, etc. which are customized to plants, seeds, or both. There are a large number of carts simultaneously operating at the assembly line grow pod 100. The master controller 106 detects occurrence of numerous events and seamlessly controls various components to provide necessary dosage to plants timely and sufficiently.

In block 904, a determination is made as to the necessary functionality needed to operate the assembly line grow pod. In some embodiments, the assembly line grow pod may have two towers structure, as shown in FIGS. 1-2. Each tower of the assembly line grow pod may have the identical set of functionalities, or two towers may have different functionalities. In other embodiments, the assembly line grow pod may have four towers structure (not shown). Each tower of such assembly line grow pod may also have the identical set of functionalities, or different functionalities. As discussed above, assets available at the assembly line grow pod 100 are considered in determining the necessary functionality.

The master controller 106 distributes and delegates the necessary functionalities to maximize use of the assets and find the best system configurations to put assets in use. In some embodiments, the master controller 106 sets up several nodes such as the robot controller 410, the cart and track controller 420, the environment controller 430, the dosage controller 440, and the light controller, as shown in FIG. 4. However, the present disclosure is not limited thereto and more or less controllers may be set up as nodes. As discussed above, the size of assembly line grow pod may vary significantly, such as a single tray to multiple pods occupying a large pile of land. These factors should be considered in determining the necessary functionalities needed to run the assembly line grow pod. In some embodiments, automating growth process of a single tray may be handled by the master controller 106 without distributing the functionality. As the size of the assembly line grow pod gets expanded and larger in scale, it may be more efficient to distribute the functions to discrete control modules.

Upon setting up of each node and connection being activated, the master controller 106 identifies the address of each node and sends out relevant parameters to each node. The simple and convenient connection is possible by using the housing of the distributed control system having multiple bays 502 shaped and sized to receive various control modules, as shown in FIGS. 6A-6B. Each bay has the plug-in type of connection mechanism and once the control module 502 is plugged-in, the connection with the master controller 106 is activated and the master controller 106 can pick up the address of the particular control module 502. Accordingly, the plug and play of various controllers such as the controllers 410, 420, 430, 440 and 445 are possible.

In block 906, a determination is made as to the necessary control modules that achieve the assembly line grow pod functionality. As discussed above, configuration of the necessary control modules may be determined based on assets available in the assembly line grow pod 100. For instance, if there may be a small number of watering robots available in the assembly line grow pod 100, the master controller 106 may control operations of the watering robots rather than delegate or distribute such operations to a discrete control module, such as the robot controller 410. However, if there may be watering robots seamlessly operating to water plants carried by 1500 carts and/or watering 50,000 locations, for example, the robot controller 410 may be configured and set up to autonomously control those watering robots. For instance, the dosage controller 440 may be needed to control watering and nutrients distribution to various portions of the assembly line grow pod, as discussed below in connection with FIG. 10.

As another example, a pump control module, or a valve control module may be needed to control and instruct operations of pumps and/or valves. As further another example, a harvest control module may be needed to control and instruct operations of the harvester component 208 (FIG. 2). Additionally, or alternatively, a seed control module may be set up to control and instruct operations of the seeder component 108 (FIG. 2). In other embodiments, a harvest control module may be configured to control the harvest component 208. In addition, a crop control module, a balance control module using water as ballast, etc. may be configured. Once the necessary control modules are determined, control modules like the control module 510 as shown in FIGS. 7A and 7B may be used to program and configure the control functionalities as determined.

In block 908, once configured, the necessary control modules are connected to the network via the bays of the distributed control system 400 in order to be connected with the master controller 106. In some embodiments, the bays may be equipped with the cables, wires, connection ports, etc. such that when the control modules are received, such modules are in the plug and play mode. The bays are also assigned with physical locators such that when the control modules are received, the master controller 106 can determine the network location of each node.

In block 910, a determination is made as to whether an issue exists, such as, for example, a control module or component thereof is in need of repair, a change in the functionality of the control module is desired, a replacement of the control module with a different control module is desired, or the like. As discussed above, the network 490 allows for different hardware devices to be connected over one common communication protocol. Moreover, the network 490 is a plug and play network requiring no address setup and conducts self-diagnostics and error correction. If not, the process may end until a time at which an issue arises. Otherwise, in block 912, the control module(s) that are responsible for the issue are determined. In block 914, the determined control module(s) are removed from the distributed control system 400. In some embodiments, removal of the control module(s) does not affect operations of other controls module(s) placed in the bays. In some embodiments, other control module(s) may receive a signal or information indicative of removal of the control module(s). The operations and functions controlled by the removed control module(s) may be related to operations and functions controlled by remaining control module(s). In those instances, the remaining control module(s) may receive the removal information and notified of the removal of the control module(s).

In block 916, the issue is corrected by performing repair, replacement, addition of new functionality, upgrade, etc. In block 918, the control module(s) are reinserted into the master controller. Again reinsertion of the control module(s) does not affect operations of other control modules inserted into the bays of the master controller. The reinsertion of the control module(s) may facilitate communication between the reinserted control module(s) and the master controller 106 which permits the control module(s) to control specific component(s) along with the master controller 106. The simple and convenient connection mechanism provided by the distributed control system 400 further facilitates distribution and delegation of various control functions between the master controller 106 and other hardware control modules.

Figure 10:
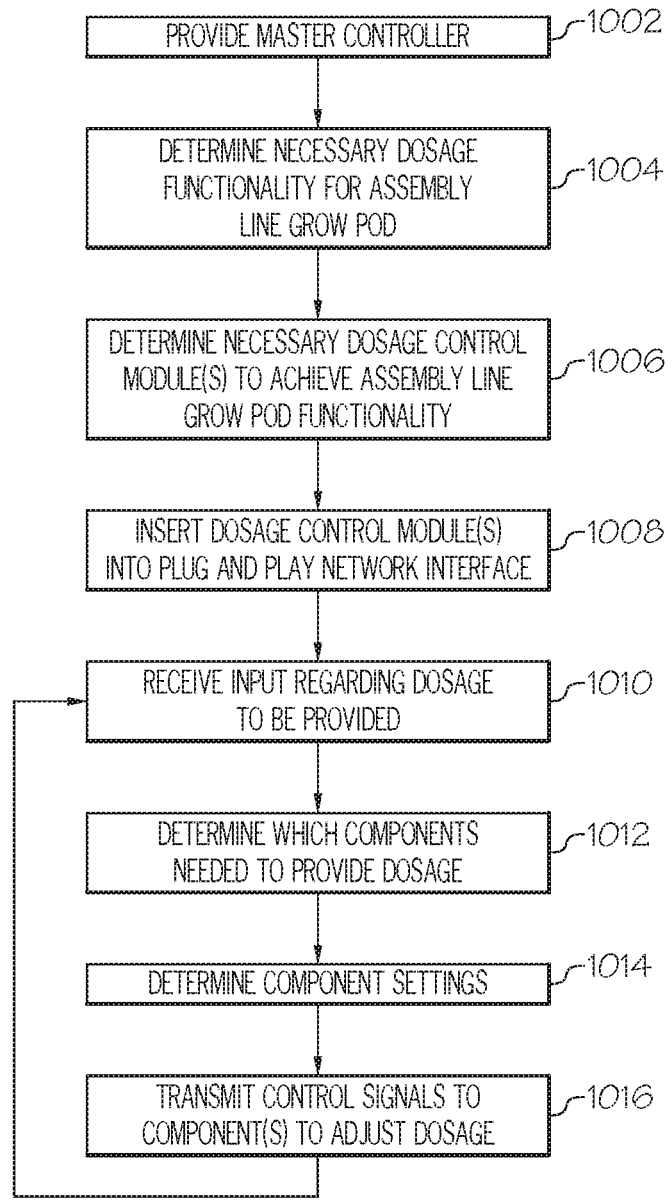
FIG. 10 depicts a flow diagram of an illustrative method of providing a dosage controller according to one or more embodiments shown and described herein.

FIG. 10 depicts an illustrative flowchart of providing dosage control hardware such as the dosage controller 440 (FIG. 4) for a modular control interface according to one embodiment. As shown in FIG. 10, the master controller is provided in block 1002. As discussed above in connection with FIGS. 1 and 2, the master controller 106 controls the entire operations of the assembly line grow pod 100 by communicating with and controlling various components of the assembly line grow pod. As discussed above, the master controller 106 includes a modular control interface that can support the dosage controller 440. The master controller 106 includes the plurality of bays 502 where each bay accommodates different control modules and enables communications between the different control modules inserted into each bay and the master controller 106. Once the dosage control module 440 is inserted into the bays, the control modules communicate with and control various relevant components associated with the dosage control module 440 under the supervision and the control of the master controller 106.

In block 1004, a determination is made as to the necessary dosage functionality needed to operate the assembly line grow pod. In some embodiments, the necessary dosage functionality include determining desired fluid provisional functionality such as determining and identifying an amount of fluid, a type of fluid (e.g., water, nutrients, etc.), a location as to where the fluid is to be pumped, the various components that are to be used to control dosage, and/or the like. Furthermore, as discussed above, the determination of the necessary dosage functionality is made in light of assets available in the assembly line grow pod 100 in order to facilitate and enable the best usage of current assets in the assembly line grow pod environment.

In block 1006, a determination is made as to the desired dosage control modules that achieve the assembly line grow pod functionality. The desired dosage control modules 510 may be configured to have the systems logic 744a and the plant log 744b that implement the determined functionality. As discussed above in connection with FIGS. 4, 7A and 7B, the control module 510 configured as the dosage controller 440 are configured to have the systems logic 744a and the plant logic 744b that implement the functionality. The dosage controller 440 is configured to have the systems logic 744 such that operations of one or more of the dosage control component, pumps, water lines, valves, fluid distribution manifolds, or other components that contain components for providing a particular dosage to the seeds and/or plants are monitored and controlled. The plant logic 744b may be configured to determine and/or receive the recipe for plant growth and may facilitate implementation of the recipe via the systems logic 744a. In some embodiments, the recipe for plant growth may dictate the timing and wavelength of light, pressure, temperature, watering, nutrients, molecular atmosphere, and/or other variables the optimize plant growth and output. In some embodiments, the plant logic 744b also contains information associating plants and their locations in the assembly line grow pod 100. Accordingly, the plant logic 744b may provide information as to plants and their corresponding locations to the systems logic 744a. Then the systems logic 744a may determine the location as to where the fluid is to be pumped and supplied based on such information. In another embodiment, the dosage controller 440 may obtain the location information of plants from other sensors, such as a proximity sensor, a weight sensor, a camera, etc. In further another embodiment, the dosage controller 440 may obtain the location information of plants from another control module that tracks the location of plants or seeds in a particular tray on a cart. In further another embodiment, the dosage controller 440 may receive the location information of plants from the master controller 106.

The dosage control modules 510 may be a single dosage control module or a plurality of control modules. A number of dosage control modules 510 may be determined based on multiple factors, such as the size of the assembly line grow pod, a number of plants, a number of the dosage control components, a number of pumps, a number of valves, frequency of dosage supply. As discussed above and shown in FIGS. 4-7, the modular control interface of the distributed control system 400 may be equipped with the plurality of bays 502 such that two or more dosage control modules can be accommodated without technical issues.

In block 1008, the desired dosage controller 440, after configuration to implement the desired functionality, is connected by being inserted into the housing of the distributed control system 400, as shown in FIGS. 4-7. Once the dosage controller 440 is inserted, the dosage controller 440 may be communicatively coupled to the master controller 106 and various components of the assembly line grow pod, such as the dosage control components, pumps, valves, etc.

In block 1010, while the dosage controller 440 is activated and in operation, an input is received regarding a dosage to be provided to a seed and/or a plant. In some embodiments, the input may be an input relating to a particular type of seed and/or plant or an input from the recipe for plant growth. As discussed above, a user may send a recipe to the dosage controller using a user computing device. In response to the input, the dosage control module 302 may determine the dosage accordingly.

In block 1012, a determination is made as to which components are needed to provide the appropriate dosage based on the input. As discussed above, the systems logic 744a of the dosage control modules 510 may include dosage control components and relevant other components. In block 1014, a determination is made as to what settings are needed for each component. For example, the settings include adjusting pumps, valves, dosage control components, etc. based on the appropriate dosage based on the input. As another example, the settings include scheduling and coordinating use of the dosage control components, the pumps, the valves, etc. based on the locations of dosage supply and the locations of plants or seeds that require dosage supply.

In block 1016, one or more signals are sent via the dosage controller 440 to the various components to adjust accordingly and provide the appropriate dosage. The process may repeat in block 1110 for each successive dosage determination as needed.

As illustrated above, various embodiments for providing distributed control systems and methods are disclosed. A distributed control system for use in an assembly line grow pod includes a control housing, a master controller, and a hardware controller device. The control housing includes a plurality of bays shaped and sized to place one or more discrete hardware controller devices. Each bay is equipped with a plug-in network interface. The master controller resides in the control housing and includes a first processor and a first memory. The first memory stores a first set of instructions that dictates plant growing operations and a second set of instructions that dictates a plurality of distributed control functions. The hardware controller device is communicatively and removably coupled to the master controller via the plug-in network interface at the time of placement in a bay of the control housing. The hardware controller device includes a second processor and a second memory for storing a third set of instructions that dictate a selected control function of the plurality of distributed control functions. Upon connection into the plug-in network interface, the master controller identifies an address of the hardware controller device and sends a set of parameters defining a plurality of tasks relating to the selected control function to the hardware controller device.

In another embodiment, the hardware controller device executes the third set of instructions with the second processor and performs the plurality of tasks relating to the selected control function by controlling one or more components associated with the selected control function. In another embodiment, the hardware controller device includes a dosage controller coupled to a plurality of dosage control components. The third set of instructions, upon execution by the second processor, perform operations including (i) determining dosage information for a particular type of plant, wherein the dosage information comprises an amount of dosage, a content of fluid, settings of the dosage control components, and a fluid supply location; (ii) selecting one or more components among the dosage control components that supply the fluid based on the dosage information; (iii) determining settings for the selected components based on the dosage information; (iv) determining a location for supplying the fluid based on a location of the particular type of plant in the assembly line grow pod; and (v) supplying the determined amount of dosage of the fluid to the fluid supply location by controlling the settings of the selected dosage control components.

In another embodiment, the dosage controller communicates with one or more of a valve, a pump, and a fluid distribution manifold via an I/O port to provide the determined amount of dosage of the fluid to the fluid supply location. In another embodiment, the hardware controller device further includes a robot controller device and the selected control function further includes controlling one or more watering robots operating in an assembly line grow pod. The hardware controller device further includes a light controller device and the selected control function further includes controlling a plurality of LED light devices to generate different light wavelength colors as dictated by the first set of instructions. The hardware controller device further includes a cart and track controller and the selected control function further includes controlling movement of a cart carrying plants on a track.

In another embodiment, the second set of instructions, upon execution by the first processor, perform operations including: (i) identifying a plurality of assets operating in an assembly line grow pod including, plants, seeds, LED lighting devices, fluid holding tanks, watering robots, pumps, valves, and carts; (ii) populating a list of tasks based on the identified assets and events resulting from execution of the first set of instructions by the first processor; (iii) determining the plurality of distributed control functions by grouping one or more tasks, the identified of assets and the events into a distributed control function; and (iv) storing, in the first memory, the plurality of distributed control functions.

In another embodiment, a distributed control system for use in an assembly line grow pod includes a master controller, a first hardware controller device, a second hardware controller device, and a plug and play network interface. The master controller includes a first processor and a first memory for storing a first set of commands that dictates plant growing operations. The first hardware controller device includes a second processor and a second memory for storing a second set of commands that controls operations of a first component. The second hardware controller device includes a third processor and a third memory for storing a third set of commands that controls operations of a second component. The first component and the second component perform operations that are a part of the plant growing operations dictated by the first set of commands. The plug and play network interface is adapted to communicatively and removably connect the master controller with the first hardware controller device and the second hardware controller device using a common communication protocol.

In another embodiment, the first hardware controller device includes a robot controller configured to control operations of watering robots and the second hardware controller device includes one of: a cart and track controller configured to control movement of carts on tracks; an environment controller configured to control operations relating to temperature, airflow, humidity and atmosphere in an assembly line grow pod; a dosage controller configured to control a dosage amount of fluid and delivery of the fluid; and a light controller configured to control operations of a plurality of LED lighting devices. The master controller transmits a set of parameters relating to the operations of the first component to the first hardware controller device using the common communication protocol. The first hardware controller device sends a notification indicating completion of the tasks to the master controller using the common communication protocol. The distributed control system further includes a third hardware controller device communicatively and removably coupled to the master controller via the plug and play network interface and including an upgraded, or repaired version of the third set of commands.

In another embodiment, a method for providing a distributed control system for use in an assembly line grow pod includes the steps of (i) arranging a control housing comprising a plurality of bays shaped and sized to place one or more discrete hardware controller devices, each bay equipped with a plug-in network interface; (ii) arranging a master controller to reside in the control housing, wherein the master controller comprises a first processor and a first memory for storing a first set of instructions that dictates plant growing operations and a second set of instructions that dictates a plurality of distributed control functions; (iii) connecting a hardware controller device with the master controller by plugging the hardware controller device in the plug-in network interface of a bay; (iv) identifying, with the master controller, an address of the hardware controller device; (v) sending, from the master controller to the hardware controller device, a set of parameters defining a plurality of tasks relating to the selected control function; and (vi) controlling, with the hardware controller device, operations of one or more components operating in an assembly line grow pod to perform the plurality of tasks. The hardware controller device includes a second processor and a second memory for storing a third set of instructions that dictate a selected control function of the plurality of distributed control functions.

In another embodiment, the method for providing a distributed control system further includes steps of (i) removing the hardware controller device from the plug-in network of the bay; (ii) modifying the third set of instructions for upgrade, reconfiguration, or repair, or alternatively replacing the third set of instructions with a new set of instructions; and (iii) reconnecting the hardware controller device having a modified third set of instructions with the bay. The method for providing a distributed control system further includes steps of sending, with the hardware controller device, a notification indicative of completion of the plurality of tasks to the master controller using a common communication protocol via the plug-in network.

As illustrated above, various embodiments for providing a modular control interface in an assembly line grow pod are disclosed. These embodiments create a control interface that can be customizable and repairable without the need to shut down the entire assembly line grow pod. The modular control interface includes a plurality of bays shaped and sized to receive a plurality of control hardware modules is arranged in the modular control interface. A first control hardware module is inserted into a first bay of the plurality of bays. A second control hardware module is removed from a second bay of the plurality of bays. A third control hardware module is inserted into the second bay of the plurality of bays. A first component of the assembly line grow pod is controlled by the control of the first control hardware module, and a third component of the assembly line grow pod is controlled by the control of the third control hardware module. Accordingly, some embodiments may include a modular control interface in an assembly line grow pod that includes a master controller having a plurality of identical bays, each of which receives any one of a plurality of control modules. Each of the plurality of control modules is configured to provide a particular functionality to the assembly line grow pod.

The above disclosure relates to the modular control interface of the assembly line grow pod, wherein the modular control interface comprises one or more identical, or different bays that are each configured to receive any one of a plurality of hot swappable control modules therein, and wherein each bay of the modular control interface comprises an I/O port that is configured to couple with a corresponding port on any one of the plurality of hot swappable control modules such that any one of the plurality of hot swappable control modules can be removed from the modular control interface without affecting the overall functionality of the modular control interface. In addition, as each control module performs specific function assigned and configured to it, such control may provide efficiency and flexibility to operations and control of the assembly line grow pod, as opposed to a consolidated control that applies to the entire operations of the assembly line grow pod.

As discussed, the modular control interface is specifically for use with the assembly line grow pod. The assembly line grow pod of the present disclosure may provide an organized plant grow pod system which facilitates a quick growing, small footprint, chemical free, low labor solution to growing microgreens and other plants for harvesting. At the same time, the assembly line grow pod may provide controlled environmental conditions (e.g., the timing and wavelength of light, pressure, temperature, watering, nutrients, molecular atmosphere, and/or other variables) and ensure that each plant or seed receives customized and selective care based on individual growth factors and parameters relevant to plants or seeds, in order to optimize plant growth and output. The modular control interface of the assembly line grow pod may ensure the efficient, flexible and effective control of various components of the assembly line grow pod.

As illustrated above, various embodiments for providing various control hardware for a modular control interface in an assembly line grow pod are disclosed. One embodiment creates a dosage control interface that specifically controls the various fluid pumps, valves, water lines, and/or fluid distribution manifolds of the assembly line grow pod. Another embodiment creates a valve control interface that specifically controls the various valves, and correspondingly, the direction of fluid flow within the assembly line grow pod. The dosage control interface and the valve control interface are hot swappable within the modular control interface such that it can be inserted and removed as necessary.

Accordingly, some embodiments may include dosage control hardware for a modular control interface in an assembly line grow pod that includes a master controller having a plurality of identical bays, each of which can receive a dosage control module. The dosage control module is particularly configured to control the various pumps, valves, water lines, and/or fluid distribution manifolds located within the assembly line grow pod such that an appropriate dosage of fluid is provided to a particular seed and/or plant within the assembly line grow pod at a particular time.

The dosage control hardware/module specifically handles control of the dosage supply and operations of the dosage control components. This allows delegation and independent control of the dosage supply from the master controller, which may help to reduce processing burden on the master controller. Also, as the assembly line grow pod may be expanding or be reduced in its size, it may be simple and effective to expand or reduce the dosage control hardware/module. In other words, if more plants or seeds may be added to the assembly line grow pod, one or more dosage control hardware/module may be configured and prepared to accommodate the added plants or seeds without requiring reprogramming, replacement, or upgrade of the master controller. If plants may be harvested and dosage supply may be reduced, extra dosage control module may be removed from the bays of the master controller, which may lead to saving of processing resource. Furthermore, configuration flexibility of the dosage control module may enable the assembly line grow pod to reflect any new or updated dosage supply need, or change with minimal changes to the existing components, the master controller, and other control modules for controlling associated components.

The above disclosure relates to dosage control hardware for a master controller in a modular control interface of an assembly line grow pod. The dosage control hardware is embodied as a module that is hot swappable within one or more bays of the master controller. The dosage control hardware includes a processing device and a non-transitory, processor readable storage medium that contains programming instructions thereon that, when executed by the processing device, causes the processing device to control one or more of a valve, a pump, and a manifold to provide a measured dose of water and/or nutrients to a seed or a plant in the assembly line grow pod.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

It should now be understood that embodiments disclosed herein include systems, methods, and non-transitory computer-readable mediums for providing a modular control interface for use in an assembly line grow pod. It should also be understood that these embodiments are merely exemplary and are not intended to limit the scope of this disclosure.

What is claimed is:

1. A distributed control system for use in an assembly line grow pod, comprising:
    a control housing comprising a plurality of bays shaped and sized to place a plurality of discrete hardware controller devices, each bay equipped with a plug-in network interface;
    a master controller residing in the control housing and including a first processor and a first memory for storing a first set of instructions that dictates plant growing operations and a second set of instructions that dictates a plurality of distributed control functions; and
    a first hardware controller device of the plurality of discrete hardware controller devices communicatively and removably coupled to the master controller in a first bay of the plurality of bays via the plug-in network interface at the time of placement in the first bay of the control housing, wherein the hardware controller device comprises a second processor and a second memory for storing a third set of instructions that dictate a first selected control function of the plurality of distributed control functions;
    a second hardware controller device of the plurality of discrete hardware controller devices communicatively and removably coupled to the master controller in a second bay of the plurality of bays via the plug-in network interface at the time of placement in the second bay of the control housing, wherein the second hardware controller device comprises a third processor and a third memory for storing a fourth set of instructions that dictate a second selected control function of the plurality of distributed control functions, wherein the first selected control function is different than the second selected control function;
    wherein upon connection into the plug-in network interface, the master controller identifies an address of the hardware controller device and sends a set of parameters defining a plurality of tasks relating to the selected control function to the hardware controller device.

2. The distributed control system of claim 1, wherein:
    the first hardware controller device executes the third set of instructions with the second processor and performs the plurality of tasks relating to the first selected control function by controlling one or more components associated with the first selected control function.

3. The distributed control system of claim 1, wherein the first hardware controller device comprises a dosage controller coupled to a plurality of dosage control components and the third set of instructions, upon execution by the second processor, perform operations comprising:
    determining dosage information for a particular type of plant, wherein the dosage information comprises an amount of dosage, a content of fluid, settings of the dosage control components, and a fluid supply location;
    selecting one or more components among the dosage control components that supply the fluid based on the dosage information;
    determining settings for the selected components based on the dosage information;
    determining a location for supplying the fluid based on a location of the particular type of plant in the assembly line grow pod; and
    supplying the determined amount of dosage of the fluid to the fluid supply location by controlling the settings of the selected dosage control components.

4. The distributed control system of claim 3, wherein the dosage controller communicates with one or more of a valve, a pump, and a fluid distribution manifold via an I/O port to provide the determined amount of dosage of the fluid to the fluid supply location.

5. The distributed control system of claim 1, wherein the first hardware controller device further includes a robot controller device and the selected control function further includes controlling one or more watering robots operating in an assembly line grow pod.

6. The distributed control system of claim 1, wherein the hardware controller device further includes a light controller device and the selected control function further includes controlling a plurality of LED light devices to generate different light wavelength colors as dictated by the first set of instructions.

7. The distributed control system of claim 1, wherein the first hardware controller device further includes a cart and track controller and the first selected control function further includes controlling movement of a cart carrying plants on a track.

8. The distributed control system of claim 1, wherein the second set of instructions, upon execution by the first processor, causes the first processor to perform operations comprising:
identifying a plurality of assets operating in an assembly line grow pod including, plants, seeds, LED lighting devices, fluid holding tanks, watering robots, pumps, valves, and carts;
populating a list of tasks based on the identified assets and events resulting from execution of the first set of instructions by the first processor;
determining the plurality of distributed control functions by grouping one or more tasks, the identified of assets and the events into a distributed control function; and
storing, in the first memory, the plurality of distributed control functions.

9. A distributed control system for use in an assembly line grow pod, comprising:
a master controller comprising a first processor and a first memory for storing a first set of commands that dictates plant growing operations;
a first hardware controller device comprising a second processor and a second memory for storing a second set of commands that controls operations of a first component that performs a first control function;
a second hardware controller device comprising a third processor and a third memory for storing a third set of commands that controls operations of a second component that performs a second control function, wherein the first control function is different than the second control function;
wherein the first component and the second component perform operations that are a part of the plant growing operations dictated by the first set of commands; and
a plug and play network interface adapted to communicatively and removably connect the master controller with the first hardware controller device and the second hardware controller device using a common communication protocol.

10. The distributed control system of claim 9, further comprising:
the first hardware controller device includes a robot controller configured to control operations of watering robots; and
the second hardware controller device includes one of:
a cart and track controller configured to control movement of carts on tracks;
an environment controller configured to control operations relating to temperature, airflow, humidity and atmosphere in an assembly line grow pod;
a dosage controller configured to control a dosage amount of fluid and delivery of the fluid; or
a light controller configured to control operations of a plurality of LED lighting devices.

11. The distributed control system of claim 9, wherein:
the master controller transmits a set of parameters relating to the operations of the first component to the first hardware controller device using the common communication protocol.

12. The distributed control system of claim 9, wherein:
the first hardware controller device sends a notification indicating completion of the tasks to the master controller using the common communication protocol.

13. The distributed control system of claim 9, further comprising:
a third hardware controller device communicatively and removably coupled to the master controller via the plug and play network interface and including an upgraded, or repaired version of the third set of commands.

14. A method for providing a distributed control system for use in an assembly line grow pod, comprising:
arranging a control housing comprising a plurality of bays shaped and sized to place one or more discrete hardware controller devices, each bay equipped with a plug-in network interface;
arranging a master controller to reside in the control housing, wherein the master controller comprises a first processor and a first memory for storing a first set of instructions that dictates plant growing operations and a second set of instructions that dictates a plurality of distributed control functions;
connecting a first hardware controller device with the master controller by plugging the first hardware controller device in the plug-in network interface of a first bay;
connecting a second hardware controller device with the master controller by plugging the second hardware controller device in the plug-in network interface of a second bay;
wherein the first hardware controller device comprises a second processor and a second memory for storing a third set of instructions that dictate a first selected control function of the plurality of distributed control functions, wherein the second hardware controller device comprises a third processor and a third memory for storing a fourth set of instructions that dictate a second selected control function of the plurality of distributed control functions, and wherein the first selected control function is different than the second selected control function;
identifying, with the master controller, an address of the first hardware controller device;
sending, from the master controller to the first hardware controller device, a set of parameters defining a plurality of tasks relating to the first selected control function; and
controlling, with the first hardware controller device, operations of one or more components operating in an assembly line grow pod to perform the plurality of tasks.

15. The method of claim 14, further comprising:
removing the first hardware controller device from the plug-in network of the first bay;
modifying the third set of instructions for upgrade, reconfiguration, or repair, or alternatively replacing the third set of instructions with a new set of instructions; and
reconnecting the first hardware controller device having a modified third set of instructions with the first bay.

16. The method of claim 14, further comprising: sending, with the first hardware controller device, a notification indicative of completion of the plurality of tasks to the master controller using a common communication protocol via the plug-in network.

17. The method of claim 14, further comprising:
identifying a plurality of assets operating in an assembly line grow pod including, plants, seeds, LED lighting devices, fluid holding tanks, watering robots, pumps, valves and carts;
populating a list of tasks based on the identified assets and events resulting from execution of the first set of instructions by the first processor;
determining the plurality of distributed control functions by grouping one or more tasks, the identified of assets and the events into a distributed control function; and storing, in the first memory, the plurality of distributed control functions.

18. The method of claim 14, further comprising:

arranging at least one of the following in the control housing:

a robot controller configured to control operations of watering robots;

a cart and track controller configured to control movement of carts on tracks;

an environment controller configured to control operations relating to temperature, airflow, humidity and atmosphere;

a dosage controller configured to control a dosage amount of fluid and delivery of the fluid; or a light controller configured to control operations of a plurality of LED lighting devices.

19. The method of claim 14, further comprising:

determining dosage information for a particular type of plant, wherein the dosage information comprises an amount of dosage, a content of fluid, settings of the dosage control components, and a fluid supply location;

selecting one or more components among the dosage control components that supply the fluid based on the dosage information;

determining settings for the selected components based on the dosage information;

determining a location for supplying the fluid based on a location of the particular type of plant in the assembly line grow pod; and supplying the determined amount of dosage of the fluid to the fluid supply location by controlling the settings of the selected dosage control components.

20. The method of claim 14, wherein connecting the first hardware controller device with the master controller further comprises communicating between the master controller and the first hardware controller device using a common communication protocol.

* * * * *